(12) United States Patent
Tsutsumi et al.

(10) Patent No.: US 12,029,037 B2
(45) Date of Patent: Jul. 2, 2024

(54) THREE-DIMENSIONAL MEMORY DEVICE WITH DISCRETE CHARGE STORAGE ELEMENTS AND METHODS FOR FORMING THE SAME

(71) Applicant: SANDISK TECHNOLOGIES LLC, Addison, TX (US)

(72) Inventors: Masanori Tsutsumi, Yokkaichi (JP); Yusuke Mukae, Nagoya (JP); Tatsuya Hinoue, Yokkaichi (JP); Yuki Kasai, Kuwana (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 404 days.

(21) Appl. No.: 17/507,224

(22) Filed: Oct. 21, 2021

(65) Prior Publication Data
US 2023/0128441 A1 Apr. 27, 2023

(51) Int. Cl.
*H10B 43/27* (2023.01)
*G11C 16/04* (2006.01)
(Continued)

(52) U.S. Cl.
CPC ......... *H10B 43/27* (2023.02); *G11C 16/0483* (2013.01); *H10B 41/10* (2023.02);
(Continued)

(58) Field of Classification Search
CPC ........ H10B 43/27; H10B 41/27; H10B 41/50; H10B 43/50; H10B 41/10; H10B 41/35; H10B 43/10; H10B 43/35; G11C 16/0483
See application file for complete search history.

(56) References Cited

U.S. PATENT DOCUMENTS 8,658,499 B2 2/2014 Makala et al.
9,252,151 B2 2/2016 Chien et al.
(Continued)

FOREIGN PATENT DOCUMENTS

CN 109346480 A 2/2019

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).
(Continued)

*Primary Examiner* — Moazzam Hossain
(74) *Attorney, Agent, or Firm* — THE MARBURY LAW GROUP PLLC

(57) ABSTRACT

A three-dimensional memory device includes an alternating stack of insulating layers and electrically conductive layers, and memory stack structures extending through the alternating stack. Each of the memory stack structures includes a vertical semiconductor channel, a tunneling dielectric layer, a vertical stack of discrete silicon nitride memory elements located at levels of the electrically conductive layers, and a vertical stack of discrete silicon oxide blocking dielectric structures laterally surrounding the vertical stack of discrete silicon nitride memory elements. Each of the silicon oxide blocking dielectric structures includes a silicon oxynitride surface region, and an atomic concentration of nitrogen atoms within the silicon oxynitride surface region decreases with a lateral distance from an interface between the silicon oxynitride surface region and a respective one of the silicon nitride memory elements.

12 Claims, 45 Drawing Sheets

(51) Int. Cl.
  *H10B 41/10* (2023.01)
  *H10B 41/27* (2023.01)
  *H10B 41/35* (2023.01)
  *H10B 43/10* (2023.01)
  *H10B 43/35* (2023.01)

(52) U.S. Cl.
  CPC .............. *H10B 41/27* (2023.02); *H10B 41/35* (2023.02); *H10B 43/10* (2023.02); *H10B 43/35* (2023.02)

(56) References Cited

U.S. PATENT DOCUMENTS

| | | | |
|---|---|---|---|
| 9,356,031 | B2 | 5/2016 | Lee et al. |
| 9,397,093 | B2 | 7/2016 | Makala et al. |
| 9,419,012 | B1 | 8/2016 | Shimabukuro et al. |
| 9,576,975 | B2 | 2/2017 | Zhang et al. |
| 9,659,955 | B1 | 5/2017 | Sharangpani et al. |
| 9,691,884 | B2 | 6/2017 | Makala et al. |
| 9,875,929 | B1 | 1/2018 | Shukla et al. |
| 9,960,180 | B1 | 5/2018 | Zhou et al. |
| 9,991,277 | B1 | 6/2018 | Tsutsumi et al. |
| 10,373,969 | B2 | 8/2019 | Zhang et al. |
| 10,516,025 | B1 | 12/2019 | Nishikawa et al. |
| 11,049,807 | B2 | 6/2021 | Li et al. |
| 11,101,289 | B1 | 8/2021 | Ueda et al. |
| 11,114,462 | B1 | 9/2021 | Cui et al. |
| 2010/0276743 | A1 | 11/2010 | Kuniya et al. |
| 2015/0364483 | A1 | 12/2015 | Koval |
| 2016/0043093 | A1 | 2/2016 | Lee et al. |
| 2016/0343718 | A1 | 11/2016 | Lu et al. |
| 2017/0125436 | A1 | 5/2017 | Sharangpani et al. |
| 2018/0019254 | A1 | 1/2018 | Jhang et al. |
| 2018/0151588 | A1 | 5/2018 | Tsutsumi et al. |
| 2019/0198510 | A1* | 6/2019 | Kim ............... H10B 43/10 |
| 2019/0214395 | A1 | 7/2019 | Zhang et al. |
| 2019/0386108 | A1 | 12/2019 | Nishikawa et al. |
| 2020/0006375 | A1 | 1/2020 | Zhou et al. |
| 2021/0265385 | A1 | 8/2021 | Rajashekhar et al. |
| 2021/0327897 | A1 | 10/2021 | Kasai et al. |

OTHER PUBLICATIONS

U.S. Appl. No. 16/849,600, filed Apr. 15, 2020, SanDisk Technologies LLC.
U.S. Appl. No. 16/849,664, filed Apr. 15, 2020, SanDisk Technologies LLC.
U.S. Appl. No. 17/169,987, filed Feb. 8, 2021, SanDisk Technologies LLC.
U.S. Appl. No. 17/189,153, filed Mar. 1, 2021, SanDisk Technologies LLC.
U.S. Appl. No. 17/192,463, filed Mar. 4, 2021, SanDisk Technologies LLC.
Notification of Transmittal of the International Search Report and Written Opinion of the International Searching Authority for International Patent Application No. PCT/US2022/028469, mailed Oct. 20, 2022, 8 pages.

* cited by examiner

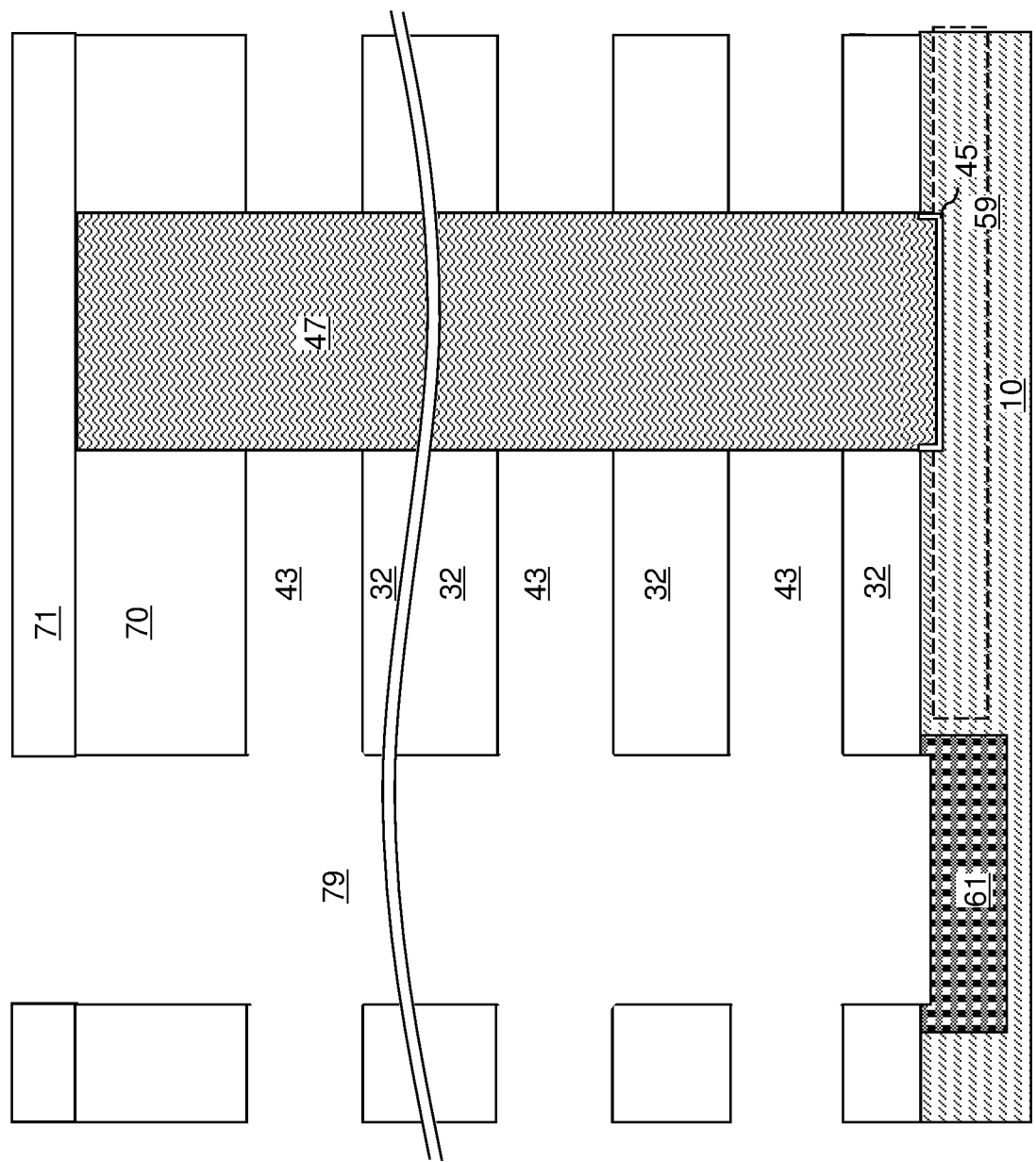

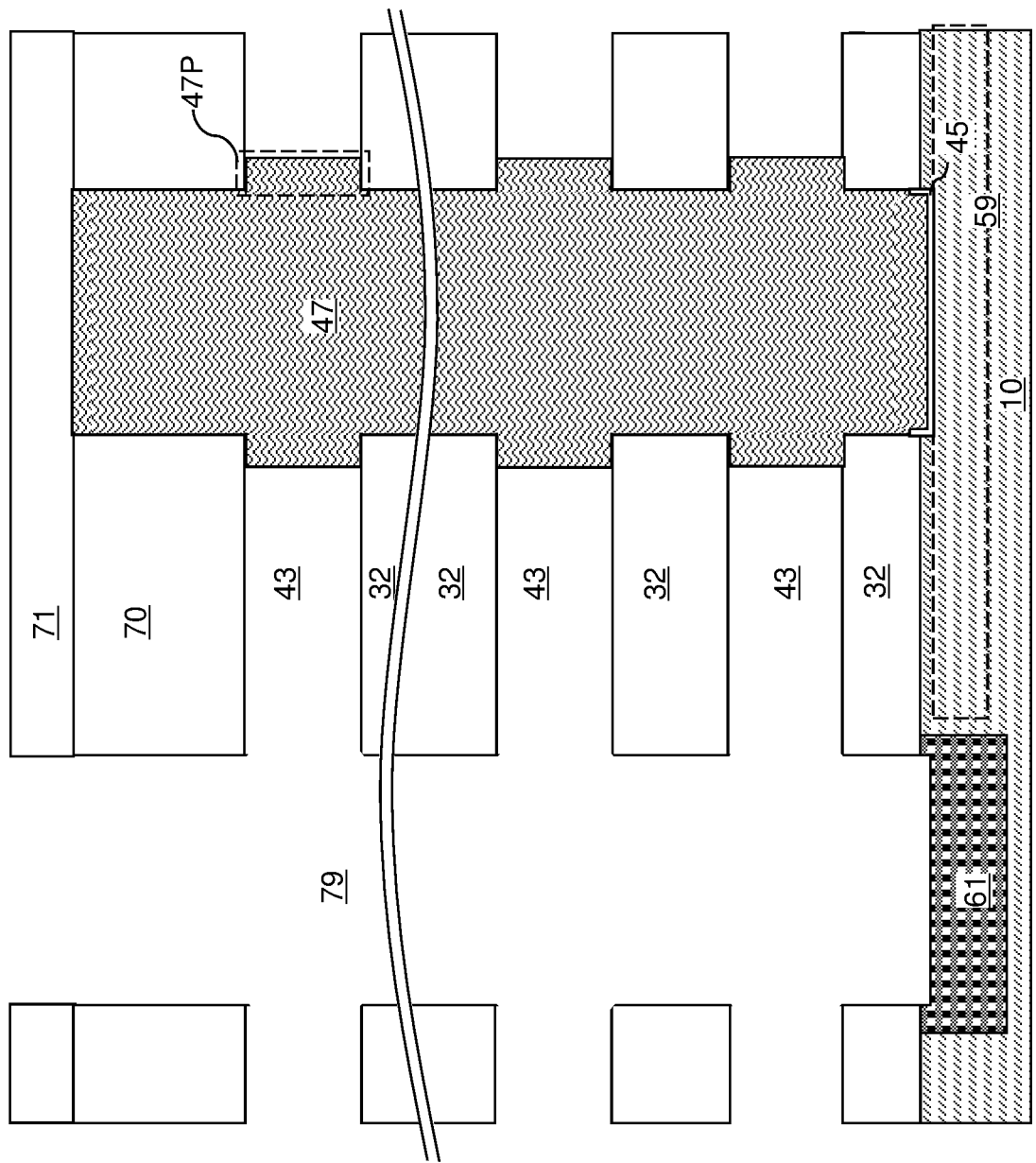

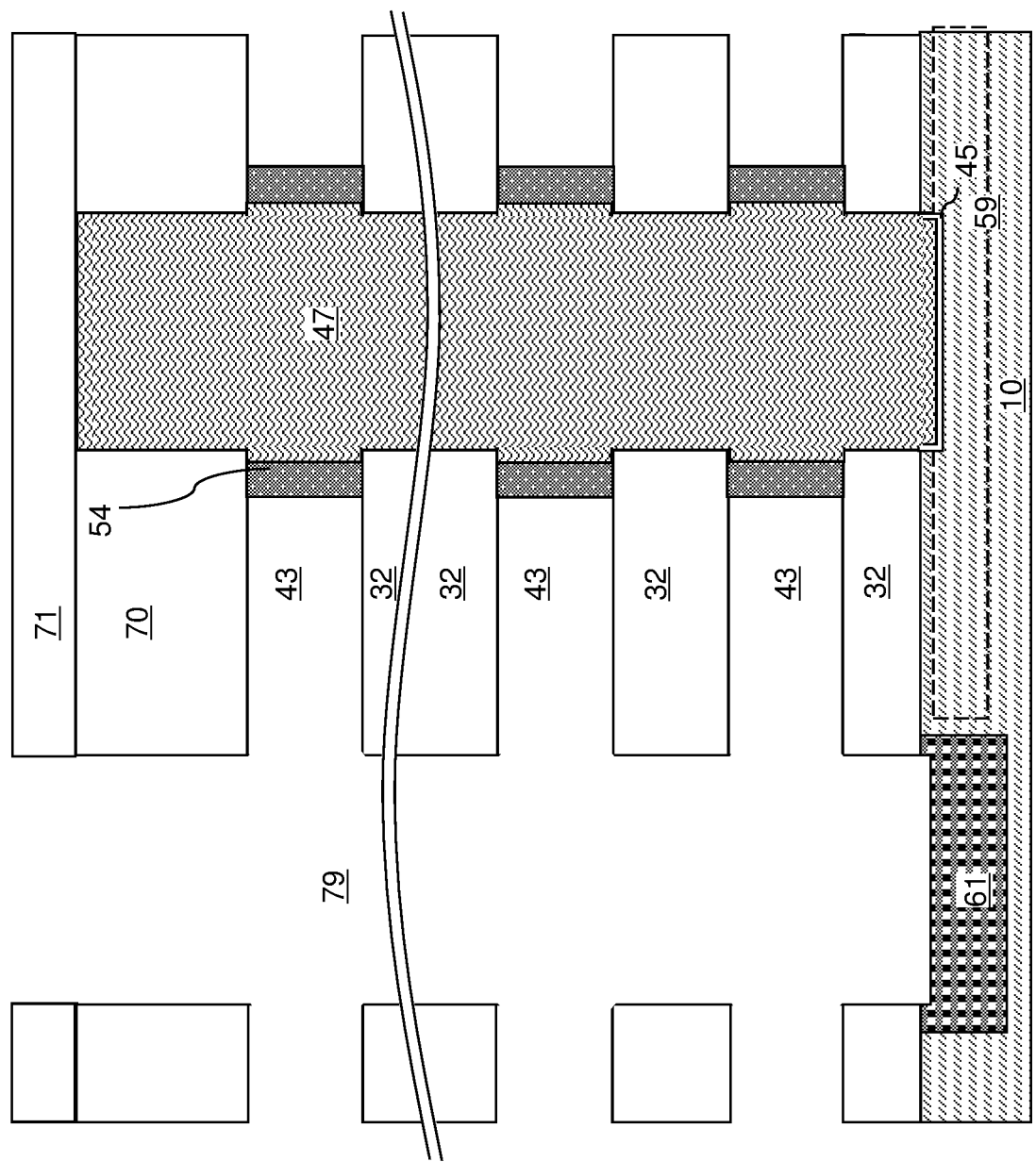

THREE-DIMENSIONAL MEMORY DEVICE WITH DISCRETE CHARGE STORAGE ELEMENTS AND METHODS FOR FORMING THE SAME

FIELD

The present disclosure relates generally to the field of semiconductor devices, and particularly to a three-dimensional memory device including discrete charge storage elements and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers; and memory stack structures extending through the alternating stack, wherein each of the memory stack structures comprises a vertical semiconductor channel, a tunneling dielectric layer vertically extending through the alternating stack, a vertical stack of discrete silicon nitride memory elements located at levels of the electrically conductive layers, and a vertical stack of discrete silicon oxide blocking dielectric structures laterally surrounding the vertical stack of discrete silicon nitride memory elements, wherein each of the silicon oxide blocking dielectric structures comprises a silicon oxynitride surface region, and an atomic concentration of nitrogen atoms within the silicon oxynitride surface region decreases with a lateral distance from an interface between the silicon oxynitride surface region and a respective one of the silicon nitride memory elements.

According to another aspect of the present disclosure, a method of forming a three-dimensional memory device is provided, which comprises: forming an alternating stack of insulating layers and sacrificial material layers over a substrate; forming a memory opening through the alternating stack; forming a sacrificial memory opening fill structure in the memory opening; forming backside recesses by removing the sacrificial material layers selective to the insulating layers and the sacrificial memory opening fill structure; forming a vertical stack of discrete silicon nitride memory elements on surface segments of the sacrificial memory opening fill structure; forming electrically conductive layers in the backside recesses; and replacing the sacrificial memory opening fill structure with material portions that comprise a tunneling dielectric layer and a vertical semiconductor channel.

BRIEF DESCRIPTION OF THE DRAWINGS

FIGS. 7A-7E are sequential vertical cross-sectional views of a region of the first exemplary structure that includes a memory opening and a backside trench during formation of electrically conductive layers and backside trench fill structures.

FIGS. 17A-17D are sequential vertical cross-sectional views of a region of the fourth exemplary structure that includes a memory opening and a backside trench during formation of electrically conductive layers and backside trench fill structures.

DETAILED DESCRIPTION

Figure 1:
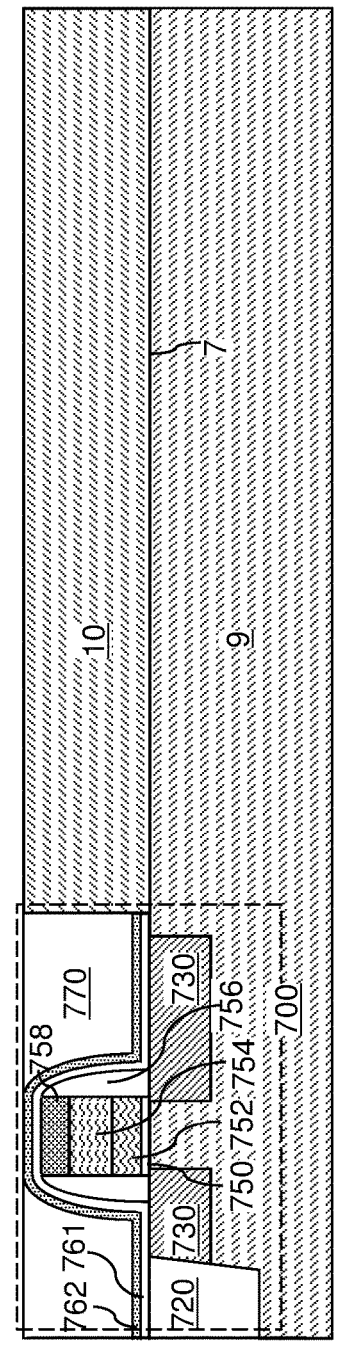
FIG. 1 is a schematic vertical cross-sectional view of a first exemplary structure after formation of at least one peripheral device, a semiconductor material layer, and a gate dielectric layer according to an embodiment of the present disclosure.

As discussed above, the embodiments of the present disclosure are directed to a three-dimensional memory device including discrete charge storage elements and methods of manufacturing the same, the various aspects of which are described below. The embodiments of the disclosure can be employed to form various structures including a multi-level memory structure, non-limiting examples of which include semiconductor devices such as three-dimensional memory array devices comprising a plurality of NAND memory strings. The discrete charge storage elements prevent or reduce leakage of charge carriers (e.g., electrons) between vertically adjacent memory cells (e.g., vertical charge loss) due to the vertical separation between the discrete charge storage elements.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to an embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
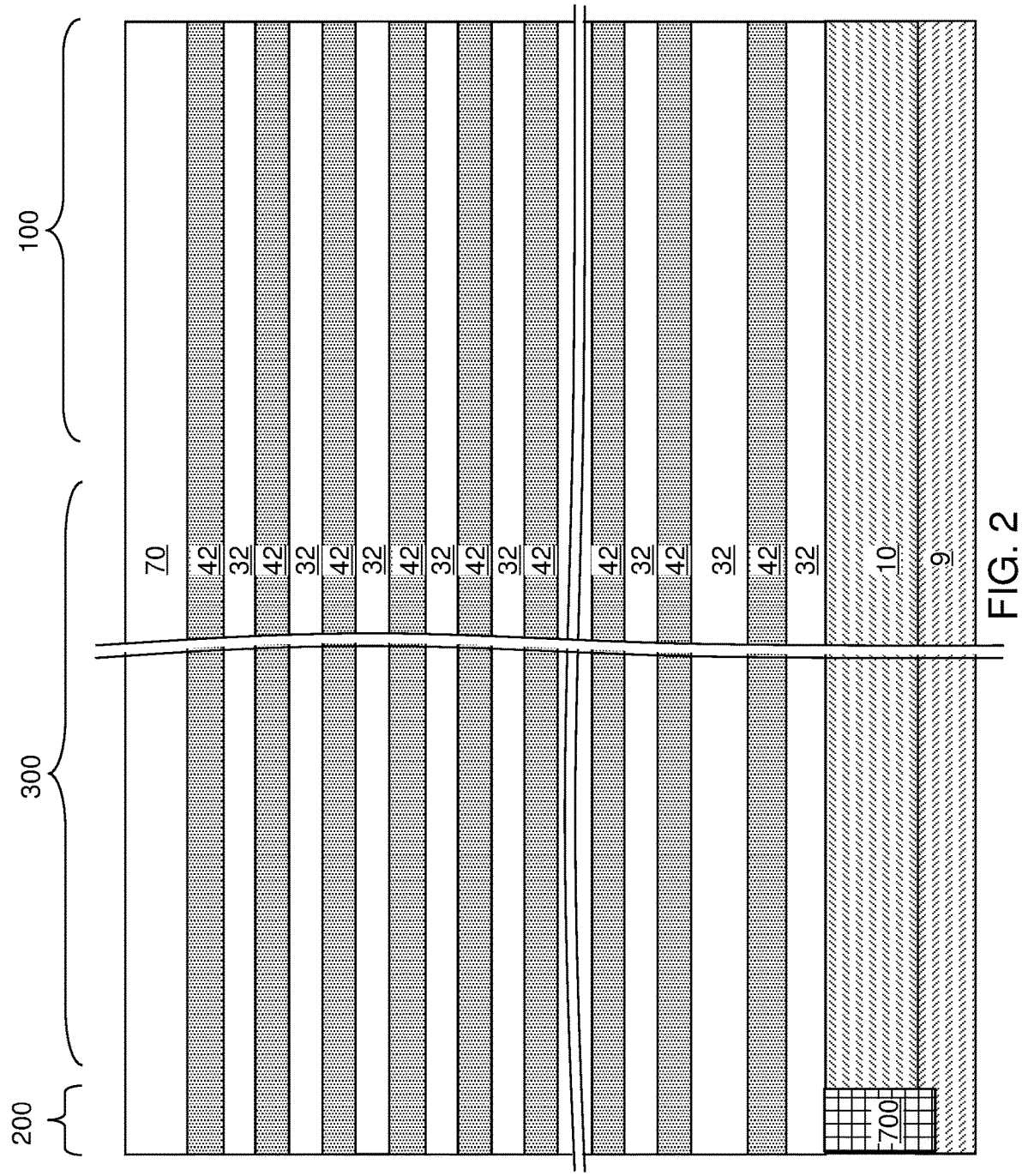
FIG. 2 is a schematic vertical cross-sectional view of the first exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. The sacrificial material layers 42 are replaced with electrically conductive layers that function as gate electrodes. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
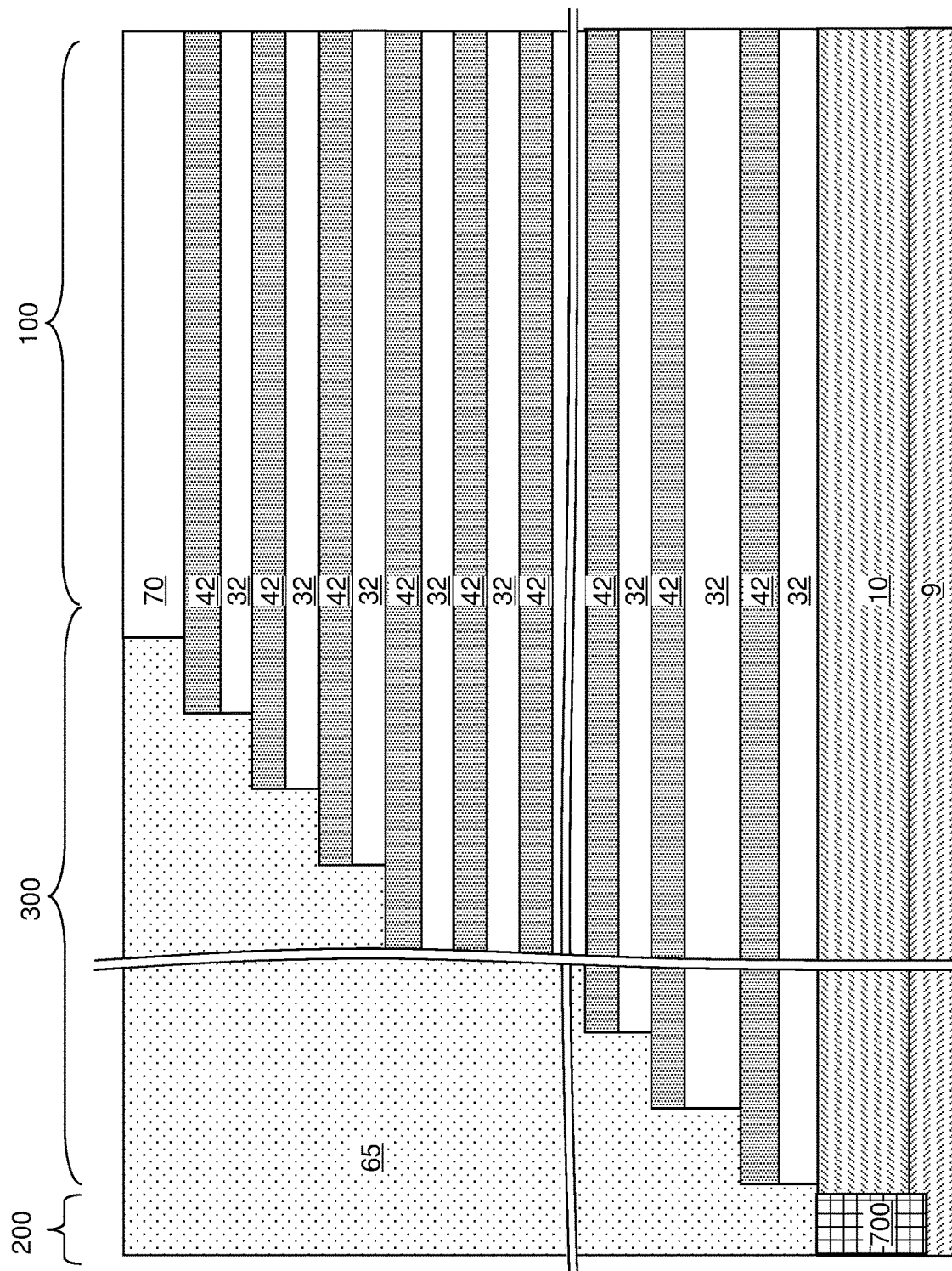
FIG. 3 is a schematic vertical cross-sectional view of the first exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
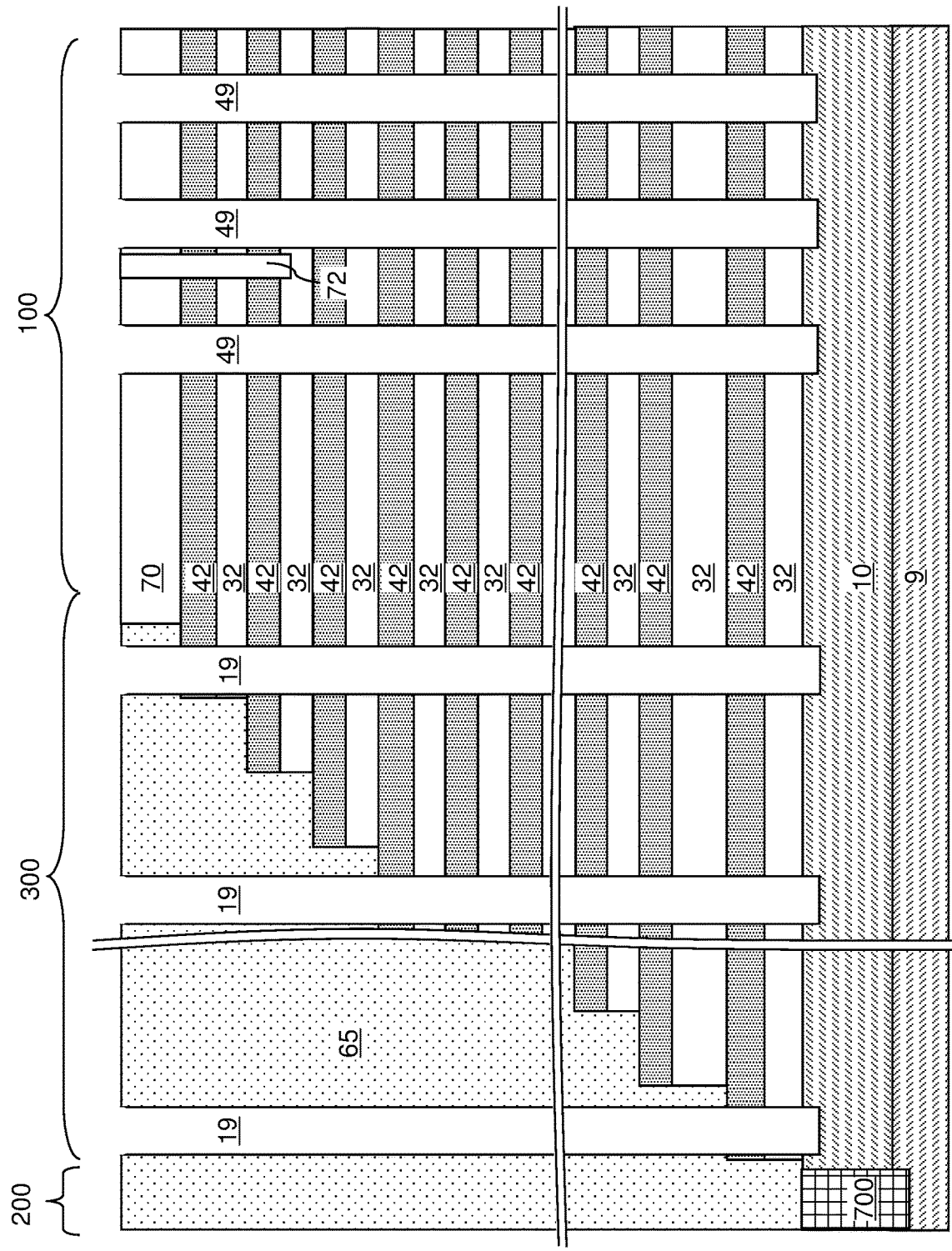
FIG. 4A is a schematic vertical cross-sectional view of the first exemplary structure after formation of memory openings and support openings according to an embodiment of the present disclosure.
Figure 4B:
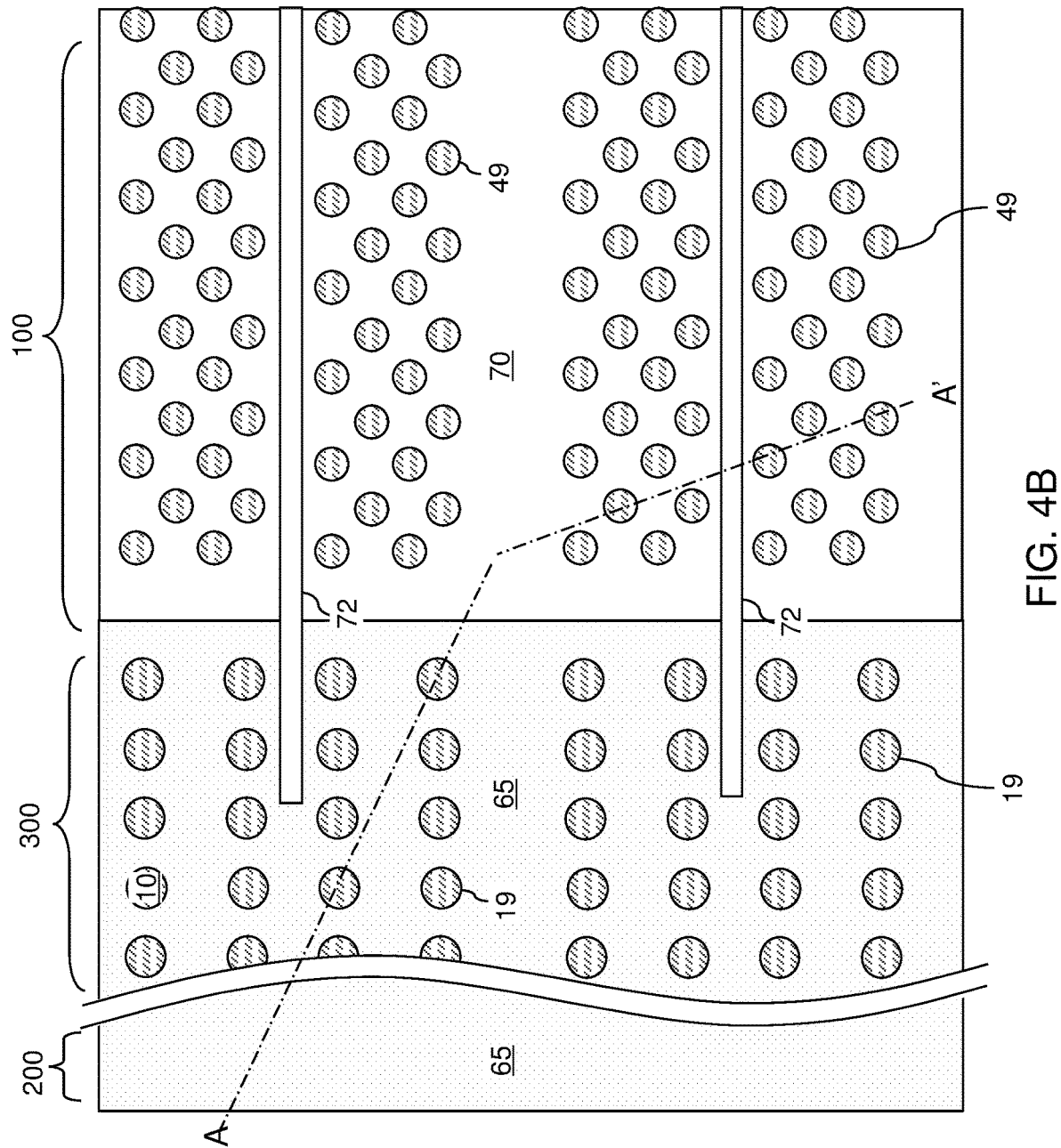
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

Figure 5:
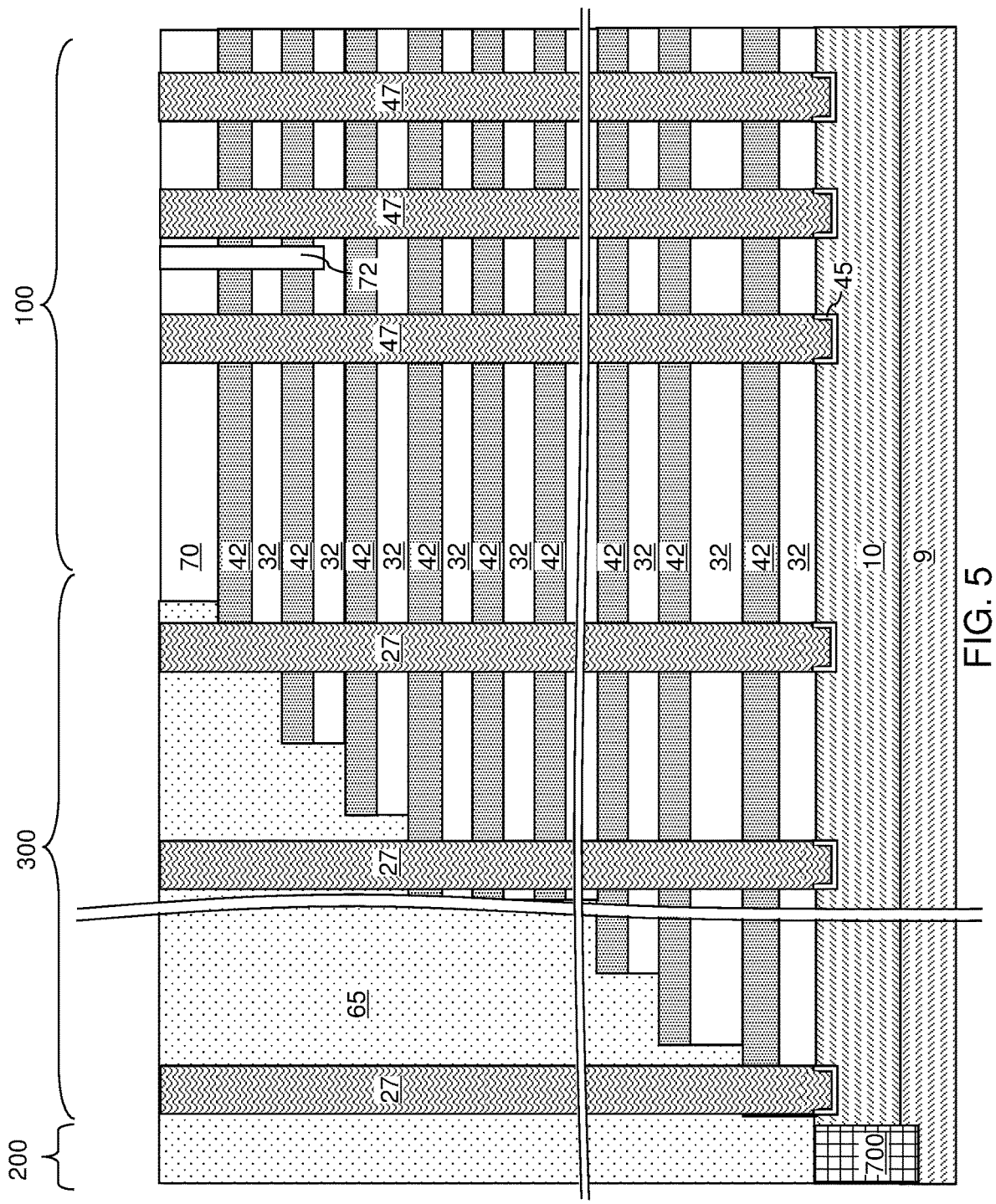
FIG. 5 is a schematic vertical cross-sectional view of the first exemplary structure after formation of sacrificial memory openings fill structures and sacrificial support opening fill structures according to an embodiment of the present disclosure.

Referring to FIG. 5, an oxidation process may be optionally performed to convert physically exposed surface portions of the semiconductor material layer underneath the memory openings 49 and the support openings 19 into sacrificial semiconductor oxide liners 45. The thickness of each sacrificial semiconductor oxide liner 45 may be in a range from 1 nm to 12 nm, such as from 2 nm to 6 nm, although lesser and greater thicknesses may also be employed.

A sacrificial fill material can be deposited in remaining volumes of the memory openings 49 and the support openings 19. The sacrificial fill material may comprise a semiconductor material, such as amorphous silicon, polysilicon, or a silicon germanium alloy. Excess portions of the sacrificial fill material can be removed from above the horizontal plane including the top surface of the insulating cap layer 70. Each remaining portion of the sacrificial fill material that fills the memory openings 49 comprises a sacrificial memory opening fill material portion 47. Each remaining portion of the sacrificial fill material that fills the support openings 19 comprises a sacrificial support opening fill material portion 27.

A sacrificial memory opening fill material portion 47 and an optional sacrificial semiconductor oxide liner 45 in a memory openings 49 constitutes a sacrificial memory opening fill structure (47, 45). A sacrificial support opening fill material portion 27 and an optional sacrificial semiconductor oxide liner 45 in a support openings 19 constitutes a sacrificial support opening fill structure (27, 45).

Figure 6A:
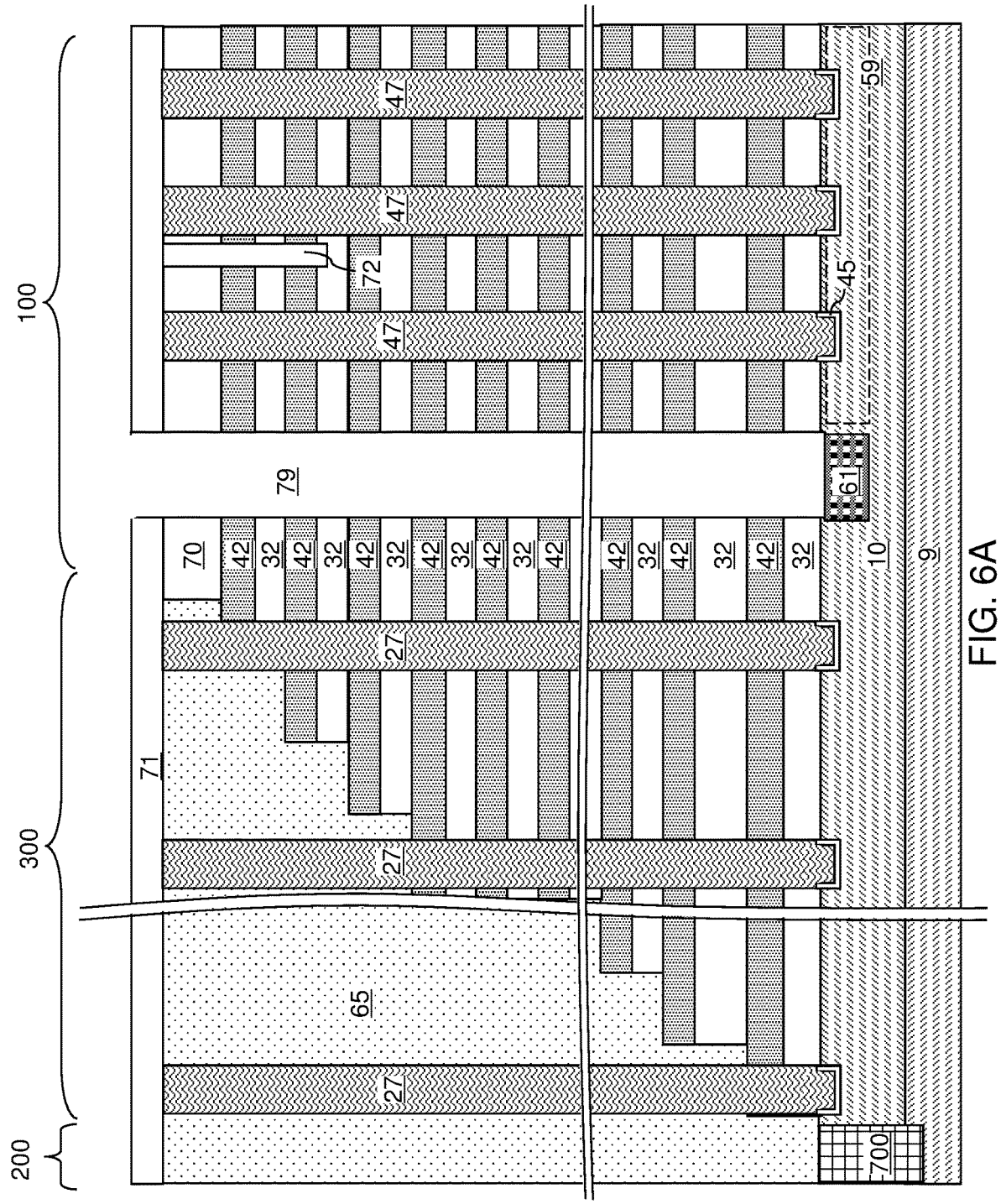
FIG. 6A is a schematic vertical cross-sectional view of the first exemplary structure after formation of backside trenches according to an embodiment of the present disclosure.
Figure 6B:
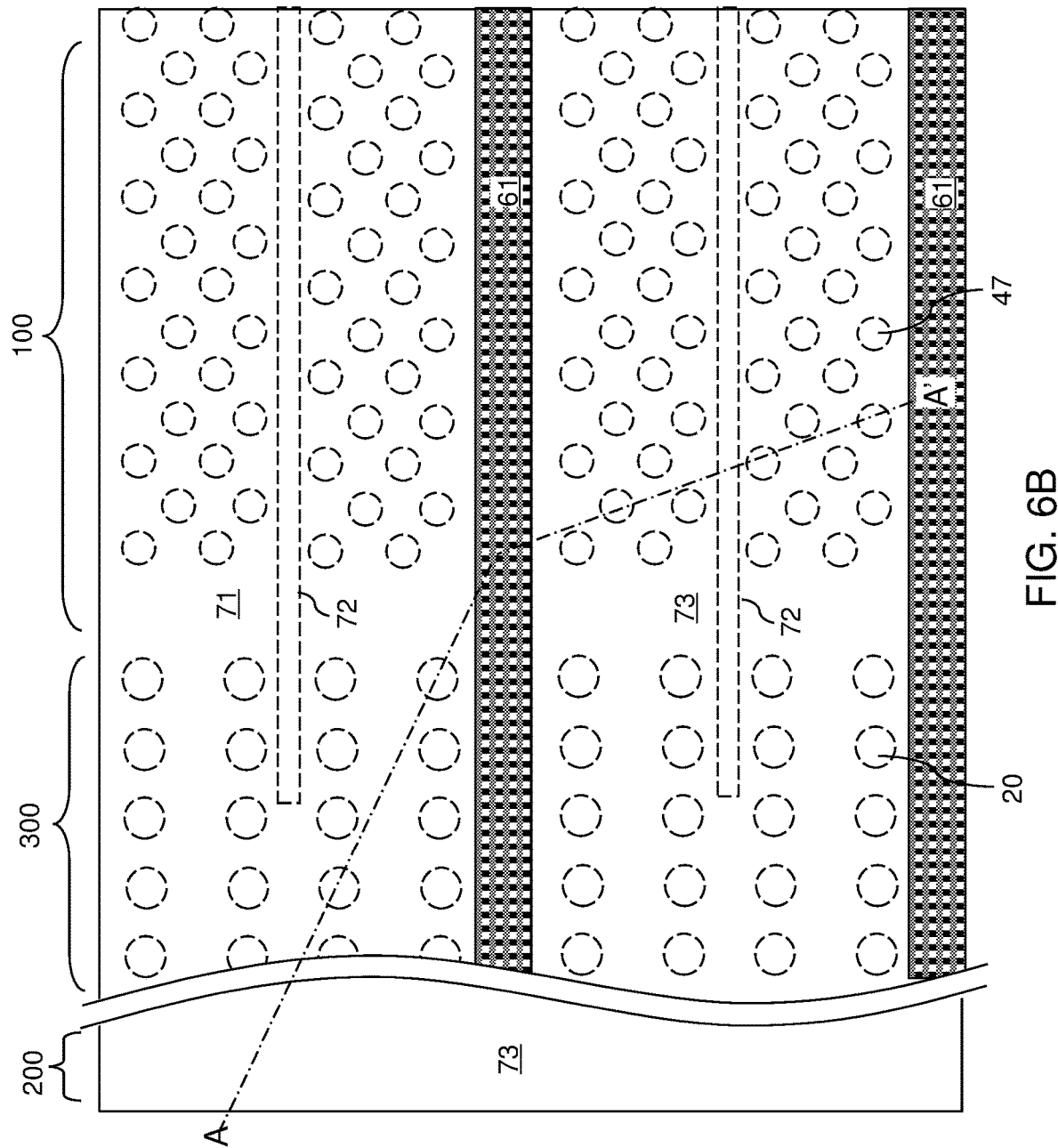
FIG. 6B is a partial see-through top-down view of the first exemplary structure of FIG. 6A. The vertical plane A-A' is the plane of the schematic vertical cross-sectional view of FIG. 6A.
Figure 6C:
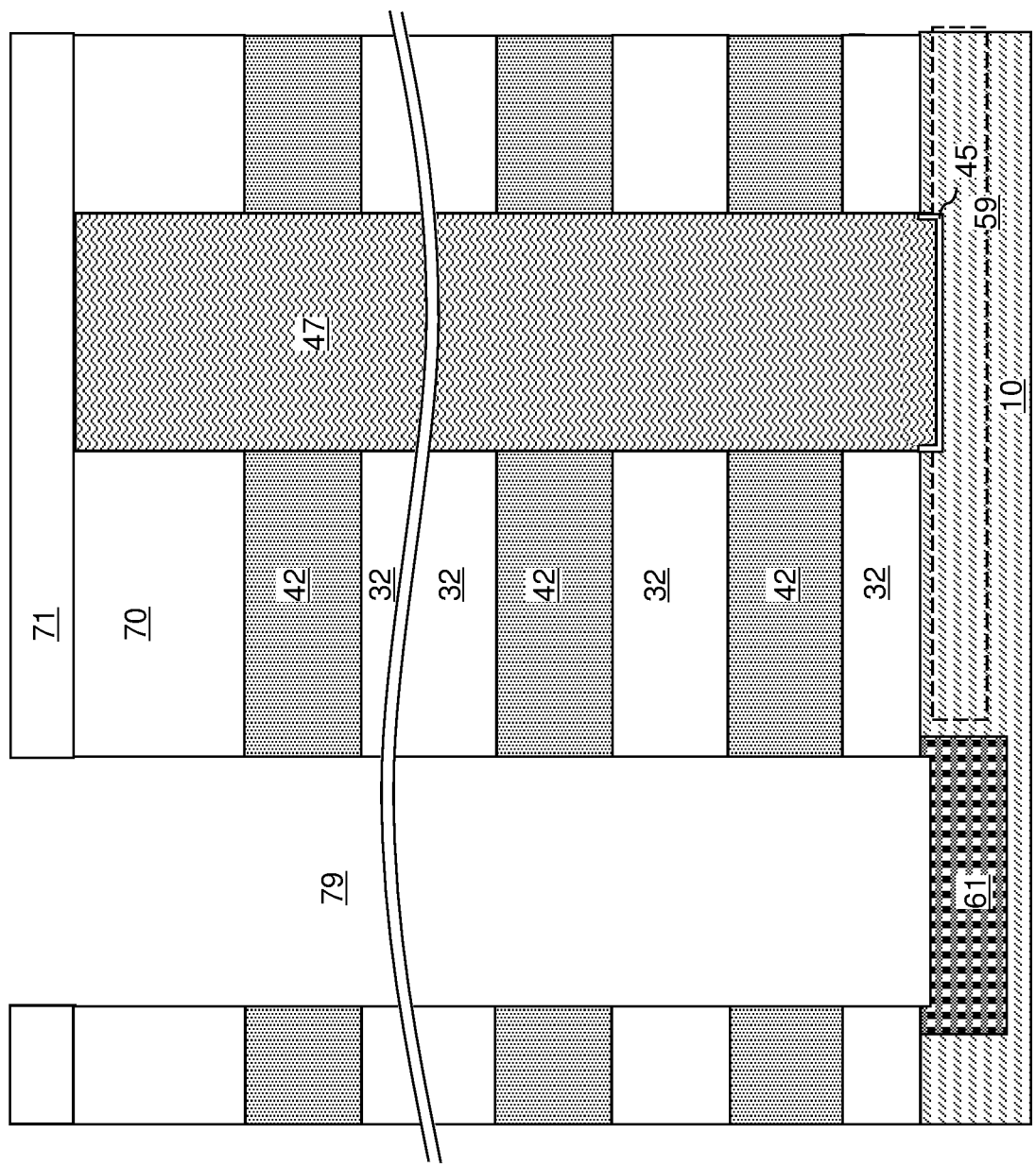
FIG. 6C is a magnified view of a region of the first exemplary structure of FIGS. 6A and 6B that includes a memory opening and a backside trench.

Referring to FIGS. 6A-6C, a sacrificial capping dielectric layer 71 may be optionally formed over the insulating cap layer 70. The sacrificial insulating cap layer 71 includes a dielectric material that is different from the dielectric material of the sacrificial material layers 42. For example, the sacrificial insulating cap layer 71 can include silicon oxide. The thickness of the sacrificial capping dielectric layer 71 may be in a range from 10 nm to 100 nm, such as from 20 nm to 50 nm, although lesser and greater thicknesses may also be employed.

A photoresist layer (not shown) can be applied over the sacrificial insulating cap layer 71, and lithographically patterned to form openings in areas between clusters of sacrificial memory opening fill structures (47, 45). The pattern in the photoresist layer can be transferred through the sacrificial insulating cap layer 71, the alternating stack (32, 42) and/or the retro-stepped dielectric material portion 65 employing an anisotropic etch to form backside trenches 79, which vertically extend from the top surface of the sacrificial insulating cap layer 71 at least to the top surface of the substrate (9, 10), and laterally extend through the memory array region 100 and the staircase region 300.

In one embodiment, the backside trenches 79 can laterally extend along a first horizontal direction (e.g., word line direction) hd1 and can be laterally spaced apart from each other along a second horizontal direction (e.g., bit line direction) hd2 that is perpendicular to the first horizontal direction hd1. The sacrificial memory opening fill structures (47, 45) can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of sacrificial memory opening fill structures (47, 45) can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can optionally be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the plurality of sacrificial memory opening fill structures (47, 45) constitutes a horizontal semiconductor channel 59 for a plurality of field effect transistors. The horizontal semiconductor channel 59 is connected to multiple vertical semiconductor channels 60 through respective sacrificial memory opening fill structures (47, 45). The horizontal semiconductor channel 59 contacts the source region 61 and the plurality of sacrificial memory opening fill structures (47, 45).

FIGS. 7A-7E are sequential vertical cross-sectional views of a region of the first exemplary structure that includes a memory opening 49 and a backside trench 79 during formation of electrically conductive layers 46 and backside trench fill structures (74, 76).

Referring to FIG. 7A, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the sacrificial memory opening fill structures (47, 45). In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the sacrificial memory opening fill structures (47, 45) can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the sacrificial memory opening fill structures (47, 45) provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the sacrificial memory opening fill structures (47, 45) are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 7B:
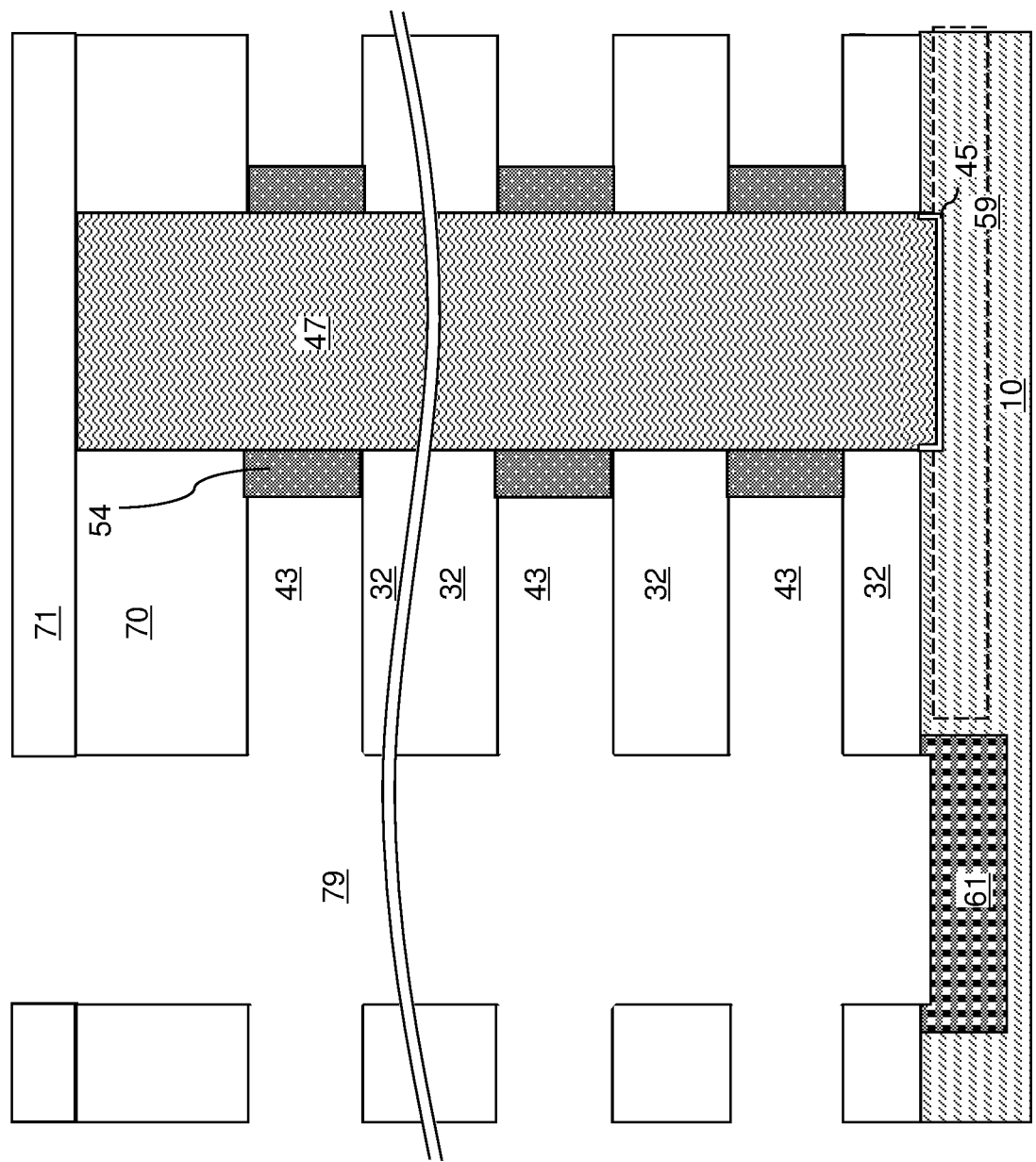

Referring to FIG. 7B, a selective silicon nitride deposition process is performed, which grows a silicon nitride material from physically exposed surfaces of the sacrificial memory opening fill structures (47, 45) while suppressing growth of the silicon nitride material from surfaces of the insulating layers 32 and the sacrificial insulating cap layer 71. silicon oxide material. In one embodiment, the selective silicon nitride deposition process may comprise a low pressure chemical vapor deposition (LPCVD) process or an atomic layer deposition (ALD) process employing ammonia and a silicon-containing precursor gas such as silane, disilane, or dichlorosilane. The materials of the sacrificial memory opening fill portions 47 and the insulating layers 32 are selected such that the silicon nitride deposition process has a greater incubation time for the silicon nitride material on the surfaces of the insulating layers 32 than on the surfaces of the sacrificial memory opening fill material portions 47. Optionally, a silicon nitride growth inhibitor, such as a self-assembled monolayer ("SAM") of an organic material can be deposited on the surface of the insulating layers 32 to further inhibit formation of silicon nitride on surfaces of the insulating layers 32. In one embodiment, the sacrificial memory opening fill material portions 47 may comprise a semiconductor material and the insulating layers 32 may comprise a silicon oxide material, and the selective silicon nitride deposition process may grow the silicon nitride material from physically exposed surfaces of the semiconductor material of the sacrificial memory opening fill material portions 47 while suppressing growth of the silicon nitride material from surfaces of the silicon oxide material of the insulating layers 32.

In one embodiment, an etch back process may be optionally performed to isotropically etch back the silicon nitride material. In this case, clusters of the silicon nitride material that collaterally nucleate on surfaces of the insulating layers 32 can be removed by the etch back process. In one embodiment, silicon nitride deposition processes and silicon nitride etch back processes may be alternately performed to increase the thickness of the silicon nitride material portions that are deposited on physically exposed sidewall segments of the sacrificial memory opening fill material portions 47.

Generally, a vertical stack of discrete silicon nitride memory elements 54 can be formed on surface segments of each sacrificial memory opening fill structure (47, 45). The lateral thickness of each silicon nitride memory element 54, as measured between an inner cylindrical sidewall and an outer cylindrical sidewall, may be in a range from 2 nm to 30 nm, such as from 4 nm to 15 nm, although lesser and greater thicknesses may also be employed.

Figure 7C:
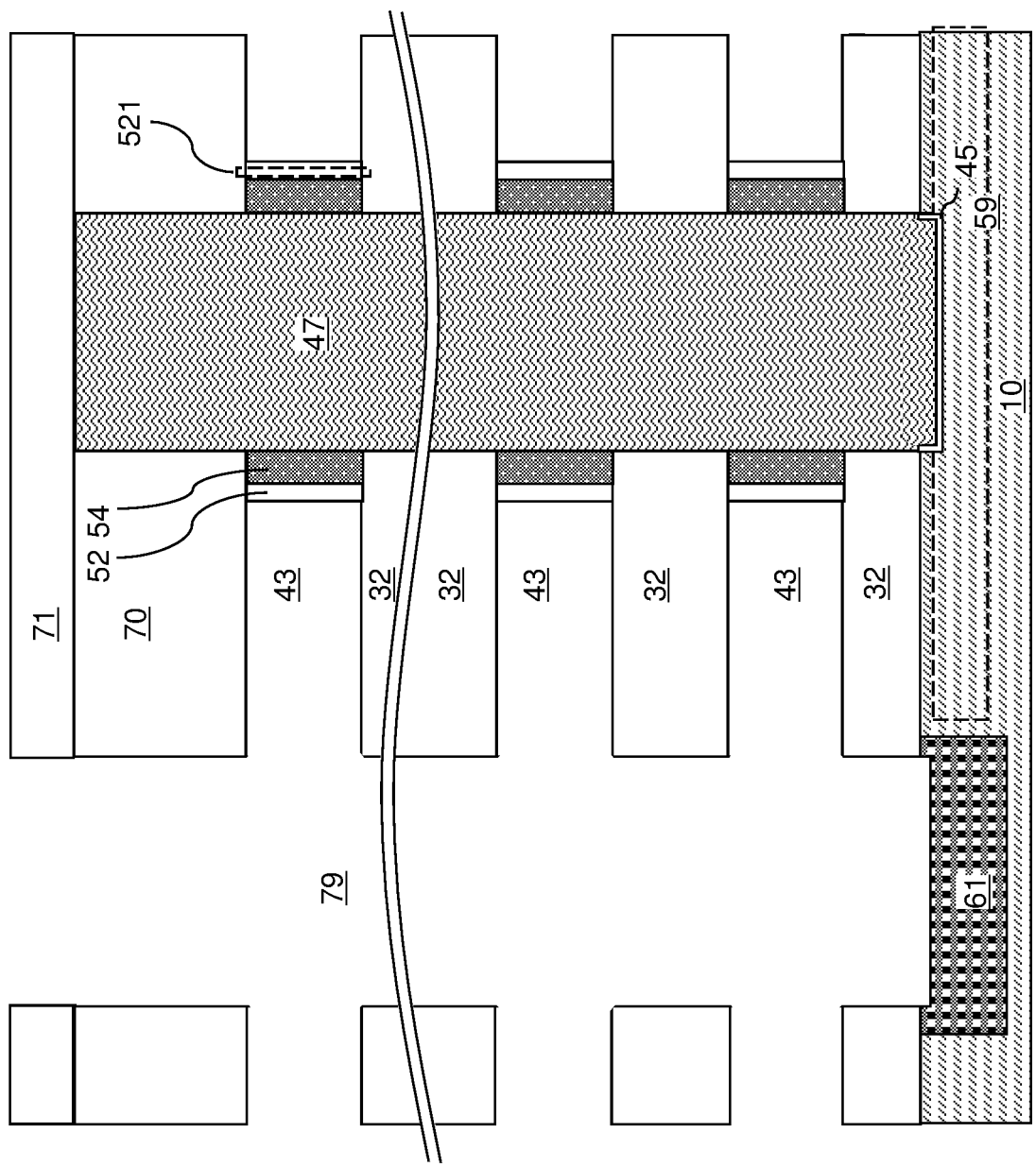

Referring to FIG. 7C, an oxidation process may be performed to convert outer surface portions of the silicon nitride memory elements 54 into silicon oxide material portions, which are herein referred to as discrete silicon oxide blocking dielectric structures 52. In one embodiment, the silicon oxide blocking dielectric structures 52 may have a material composition of $SiO_{2-\delta}N_{2\delta/3}$, in which $\delta$ is in a range from 0 to 1. In one embodiment, the value of $\delta$ may be 0 at an outer sidewall of each silicon oxide blocking dielectric structure 52, and may be 1 at an interface with a silicon nitride memory element 54.

Generally, a vertical stack of silicon oxide blocking dielectric structures 52 can be formed by oxidizing tubular surface portions of each vertical stack of silicon nitride memory elements 54. In one embodiment, each of the silicon oxide blocking dielectric structures 52 comprises a silicon oxynitride surface region 521, and the atomic concentration of nitrogen atoms within the silicon oxynitride surface region 521 decreases with a lateral distance from an interface between the silicon oxynitride surface region and a respective one of the silicon nitride memory elements 54. The thickness of each silicon oxide blocking dielectric structure 52, as measured between an inner sidewall and an outer sidewall, may be in a range from 1 nm to 15 nm, such as from 2 nm to 10 nm, although lesser and greater thicknesses may also be employed. The thickness of each silicon nitride memory element 54 after formation of the silicon oxide blocking dielectric structures 52 may be in a range from 1 nm to 15 nm, such as from 2 nm to 10 nm, although lesser and greater thicknesses may also be employed.

Figure 7D:
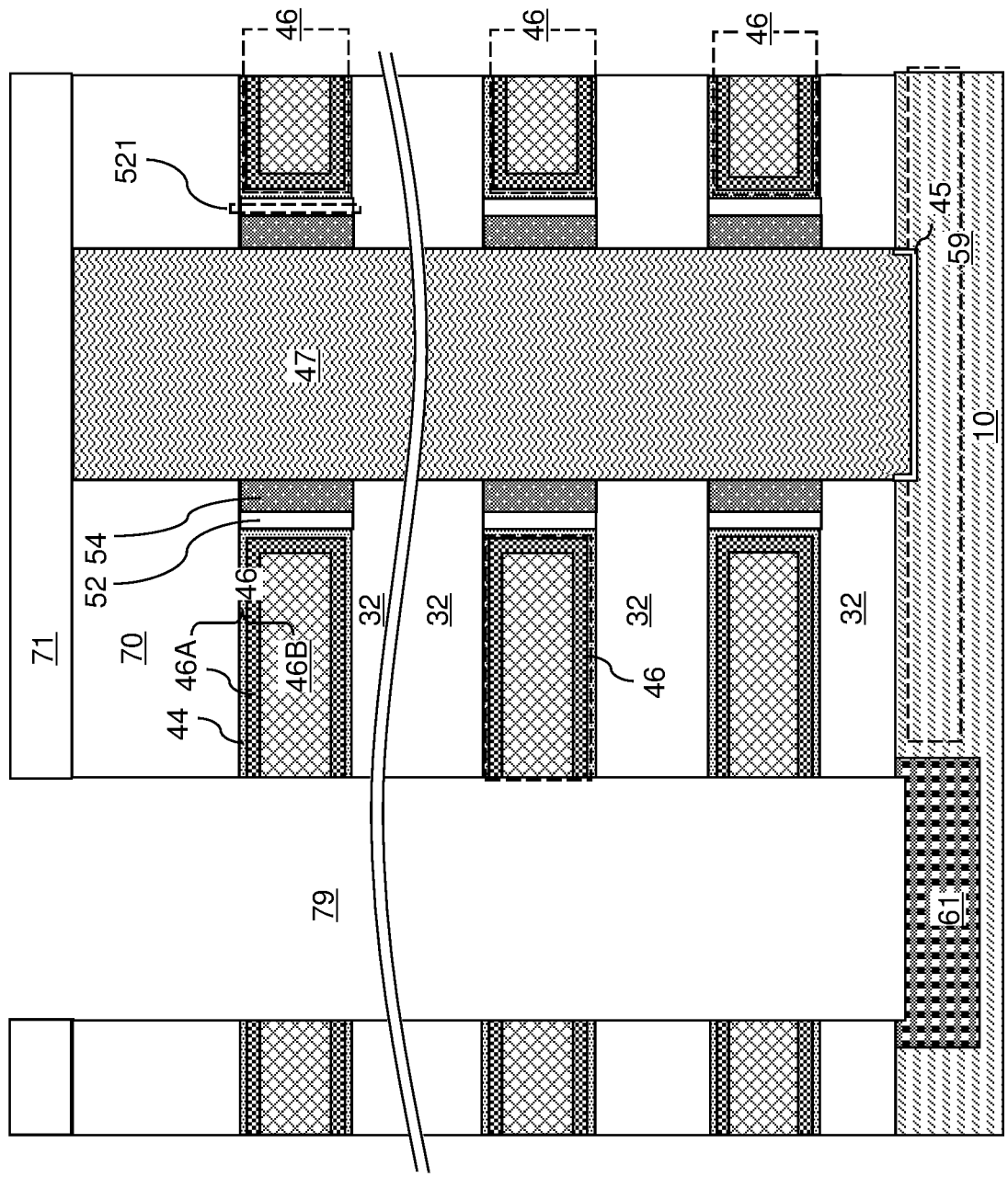

Referring to FIG. 7D, a backside blocking dielectric layer 44 can be optionally formed. The backside blocking dielectric layer 44, if present, comprises a dielectric material that functions as a control gate dielectric for the control gates to be subsequently formed in the backside recesses 43.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the sacrificial memory opening fill structures (47, 45) within the backside recesses 43. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. A backside cavity 79' is present within the portion of each backside trench 79 that is not filled with the backside blocking dielectric layer 44.

A metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Referring to FIGS. 9D and 10, a metal fill material is deposited in the plurality of backside recesses 43, on the sidewalls of the at least one the backside trench 79, and over the top surface of the sacrificial insulating cap layer 71 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the sacrificial memory opening fill structures (47, 45) by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer (not illustrated) can be formed on the sidewalls of each backside trench 79 and over the sacrificial insulating cap layer 71. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer includes a continuous portion of the metallic barrier layer 46A and a continuous portion of the metallic fill material layer 46B that are located in the backside trenches 79 or above the sacrificial insulating cap layer 71.

Each sacrificial material layer 42 can be replaced with an electrically conductive layer 46. A backside cavity 79' is present in the portion of each backside trench 79 that is not filled with the backside blocking dielectric layer 44 and the continuous metallic material layer.

The deposited metallic material of the continuous electrically conductive material layer is etched back from the sidewalls of each backside trench 79 and from above the sacrificial insulating cap layer 71, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the sacrificial memory opening fill structures (47, 45). In other words, each electrically conductive layer 46 can be a word line that functions as a common control gate electrode for the plurality of vertical memory devices.

In one embodiment, the removal of the continuous electrically conductive material layer can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer may not be selective to the material of the backside blocking dielectric layer 44 or, the backside blocking dielectric layer 44 may not be employed. Any residual dielectric material portion that may be present on top surfaces of the source regions 61 can be removed during removal of the continuous electrically conductive material layer. A backside cavity 79' is present within each backside trench 79.

At least one bottommost electrically conductive layer 46 provided upon formation of the electrically conductive layers 46 within the alternating stack (32, 46) can comprise a source side select gate electrode for the vertical NAND strings. At least one topmost electrically conductive layer 46 provided upon formation of the electrically conductive layers 46 within the alternating stack (32, 46) can comprise a drain side select gate electrode for the vertical NAND string. Each source region 61 is formed in an upper portion of the semiconductor substrate (9, 10).

Figure 7E:
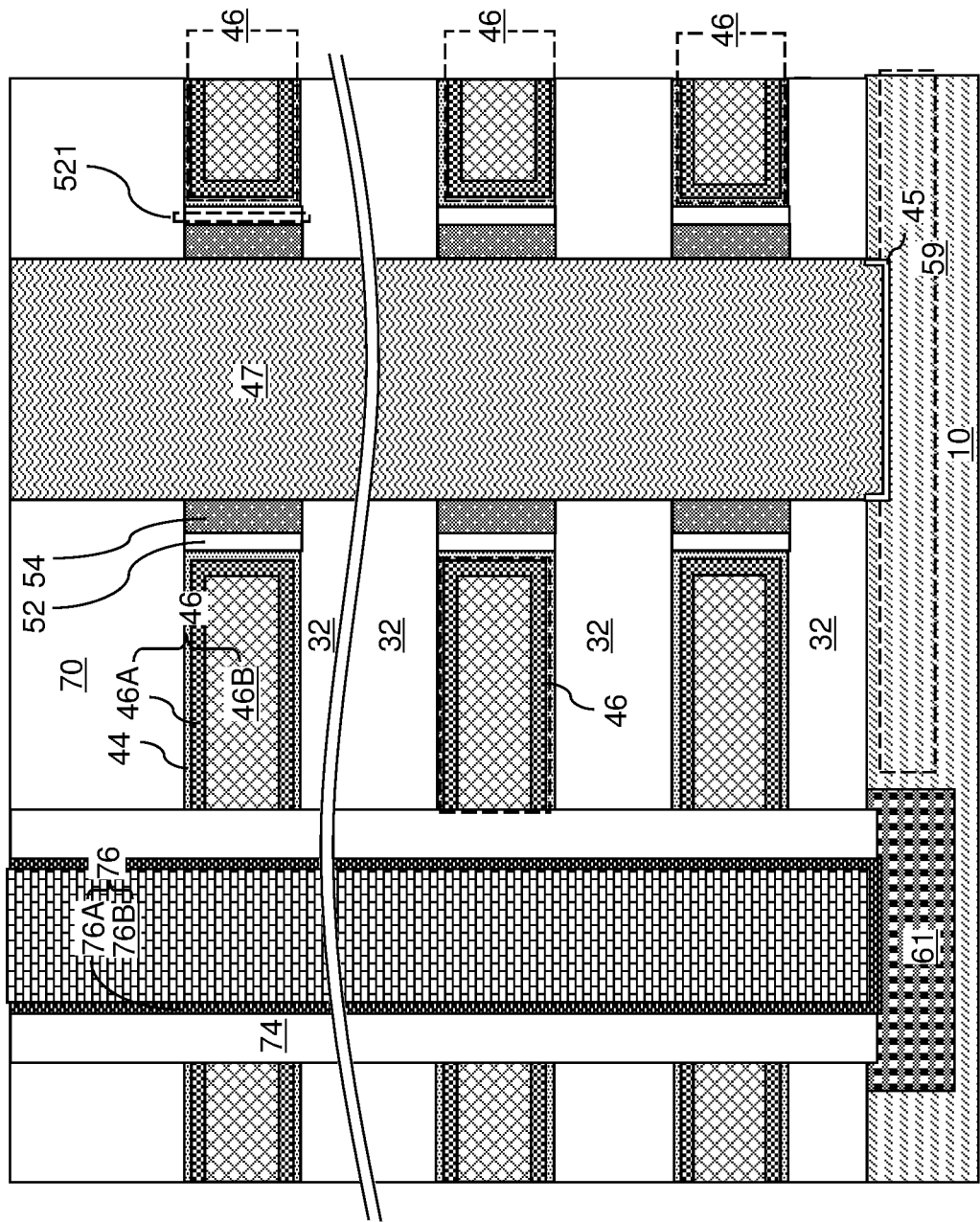

Referring to FIG. 7E, an insulating material layer can be formed in the backside trenches 79 and over the sacrificial insulating cap layer 71 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the sacrificial insulating cap layer 71 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 or the source region 61 (if present) can be physically exposed at the bottom of each backside trench 79.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be removed from above the horizontal plane including the top surface of the insulating cap layer 70 by performing a planarization process such as a chemical mechanical polishing (CMP) process. The sacrificial insulating cap layer 71 can be collaterally removed from above the top surface of the insulating cap layer 70 during the CMP process. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact an side of the lower portion of the semiconductor channel 60.

FIGS. 8A-8D are sequential vertical cross-sectional views of a region of the first exemplary structure that includes a memory opening 49 and a backside trench 79 during replacement of sacrificial memory opening fill structures (47, 45) with memory opening fill structures 58.

Figure 8A:
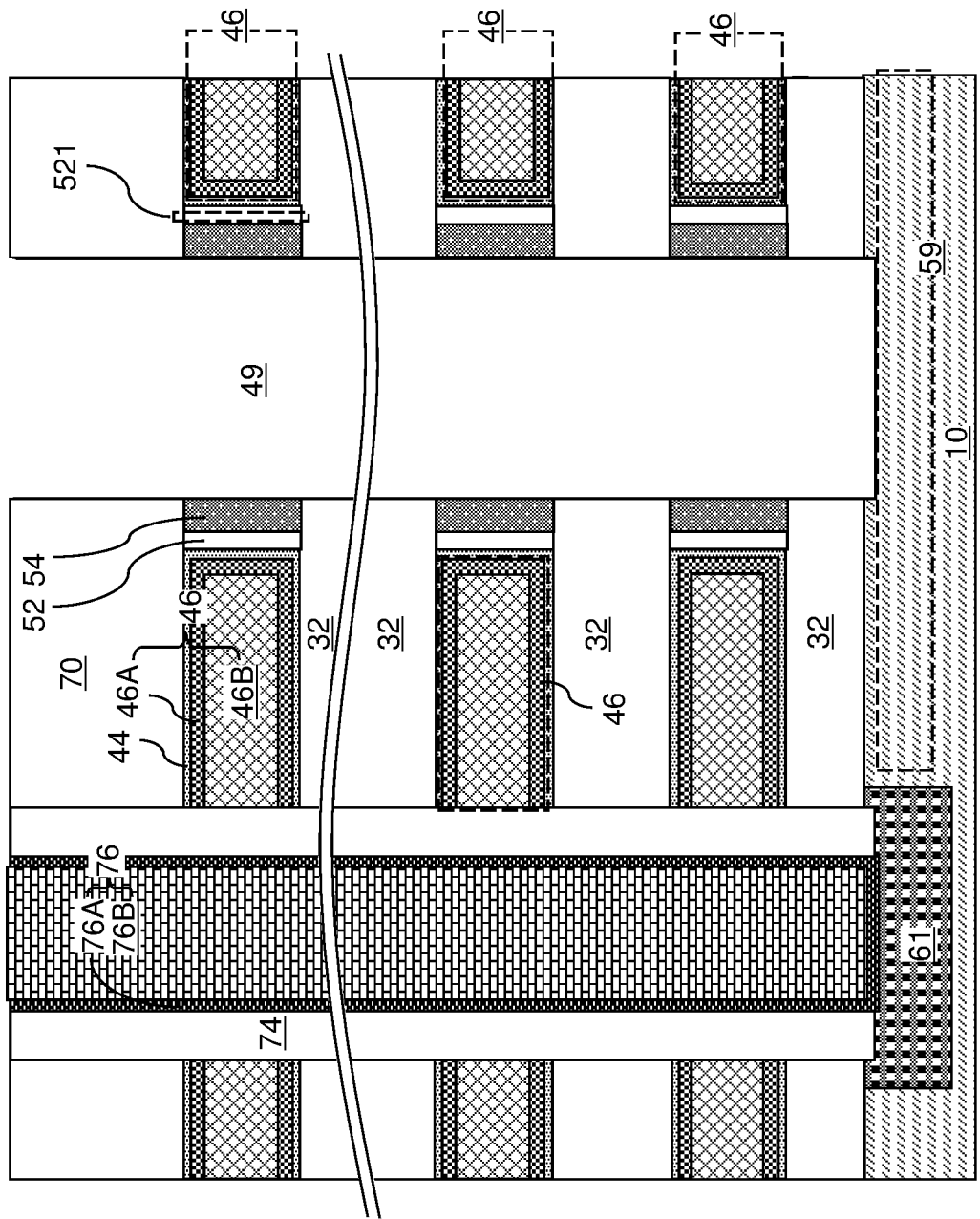
FIGS. 8A-8D are sequential vertical cross-sectional views of a region of the first exemplary structure that includes a memory opening and a backside trench during replacement of sacrificial memory opening fill structures with memory opening fill structures.

Referring to FIG. 8A, an etch process can be performed to remove the sacrificial memory opening fill material portions 47 and the sacrificial support opening fill material portions 27 selective to the materials of the insulating layers 32, the insulating cap layer 70, the silicon nitride memory elements 54, and the optional sacrificial semiconductor oxide liners 45. In one embodiment, the sacrificial memory opening fill material portions 47 and the sacrificial support opening fill material portions 27 comprises a semiconductor material such as amorphous silicon, polysilicon, or a silicon-germanium alloy, and the etch process may comprise a wet etch process employing trimethyl-2 hydroxyethyl ammonium hydroxide ("hot TMY"), tetramethyl ammonium hydroxide (TMAH), or potassium hydroxide. Subsequently, the sacrificial semiconductor oxide liners 45 can be removed by an additional etch process, which may comprise a wet etch process or a reactive ion etch process. Memory cavities are formed in the volumes of the memory openings 49. Support cavities are formed in the volumes of the support openings 19. Generally, the sacrificial memory opening fill structures (47, 45) can be removed selective to the vertical stack of silicon nitride memory elements 54 and selective to the insulating layers 32.

Figure 8B:
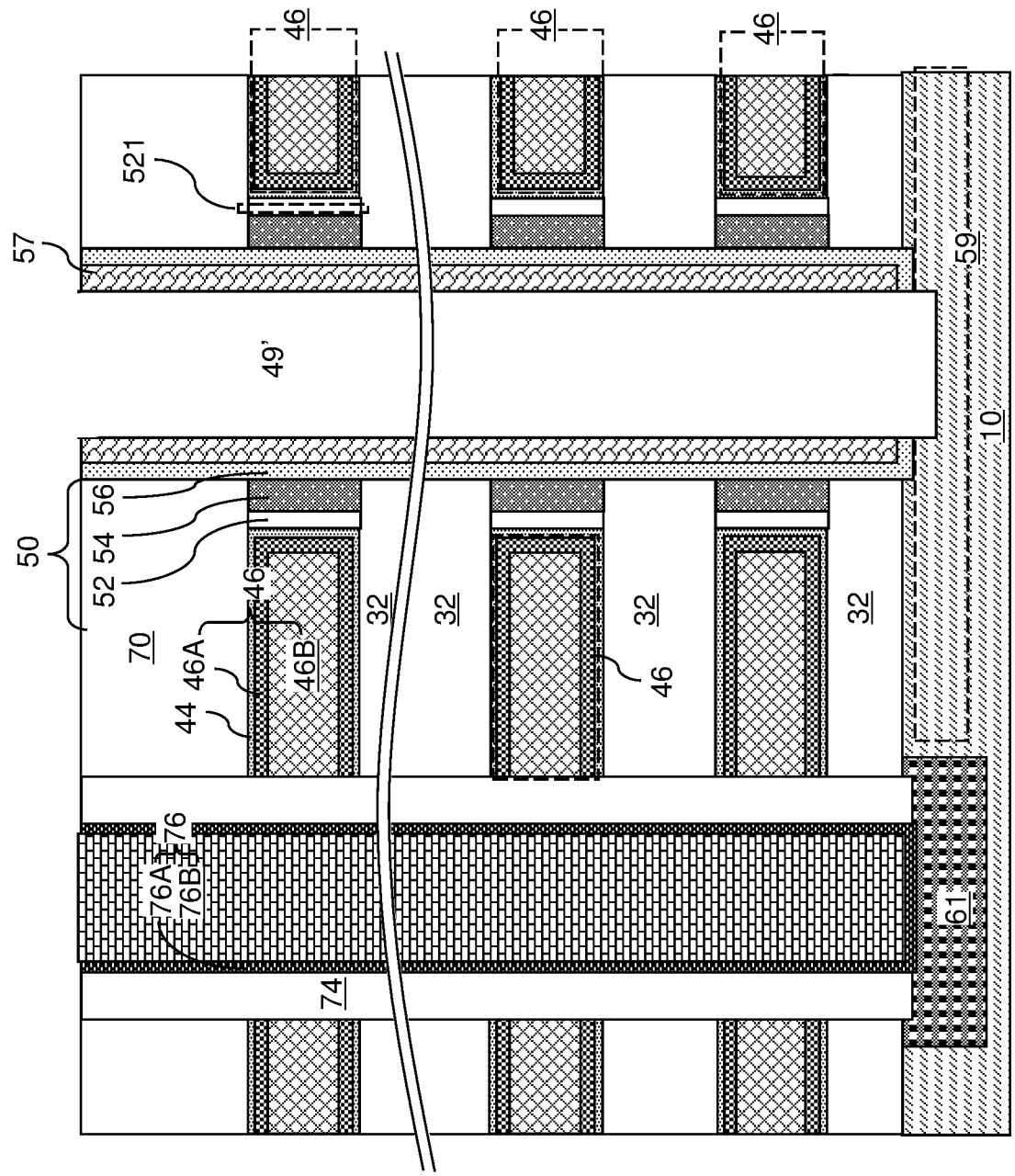

Referring to FIG. 8B, a tunneling dielectric layer 56 and an optional sacrificial cover material layer 57 can be deposited in each of the memory openings 49 and the support openings 19. The tunneling dielectric layer 56 can be deposited on cylindrical inner sidewalls of the vertical stacks of silicon nitride memory elements 54. The tunneling dielectric layer 56 comprises a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional sacrificial cover material layer 57 includes a sacrificial material that can be subsequently removed selective to the material of the tunneling dielectric layer 56. In one embodiment, the sacrificial cover material layer 57 can include a semiconductor material such as amorphous silicon, or may include a carbon-based material such as amorphous carbon or diamond-like carbon (DLC). The sacrificial cover material layer 57 can be formed by a conformal deposition method such as low pressure chemical vapor deposition (LPCVD). The thickness of the sacrificial cover material layer 57 can be in a range from 2 nm to 10 nm, although lesser and greater thicknesses can also be employed. A memory cavity 49' is formed in the volume of each memory opening 49 that is not filled with the deposited material layers (56, 57).

The optional sacrificial cover material layer 57 and the tunneling dielectric layer 56 are anisotropically etched employing at least one anisotropic etch process. The portions of the sacrificial cover material layer 57 and the tunneling dielectric layer 56 located above the top surface of the insulating cap layer 70 can be removed by the at least one anisotropic etch process. Further, the horizontal portions of the sacrificial cover material layer 57 and the tunneling dielectric layer 56 located at a bottom of each memory cavity 49' can be removed to form openings in remaining portions thereof. Each of the sacrificial cover material layer 57 and the tunneling dielectric layer 56 can be etched by a respective anisotropic etch process employing a respective etch chemistry. Each remaining portion of the sacrificial cover material layer 57 can have a tubular configuration. Each remaining portion of the tunneling dielectric layer 56 can have a tubular configuration. Each contiguous combination of a vertical stack of silicon oxide blocking dielectric structures 52, a vertical stack of silicon nitride memory elements 54, and a tunneling dielectric layer 56 constitutes a memory film 50.

Figure 8C:
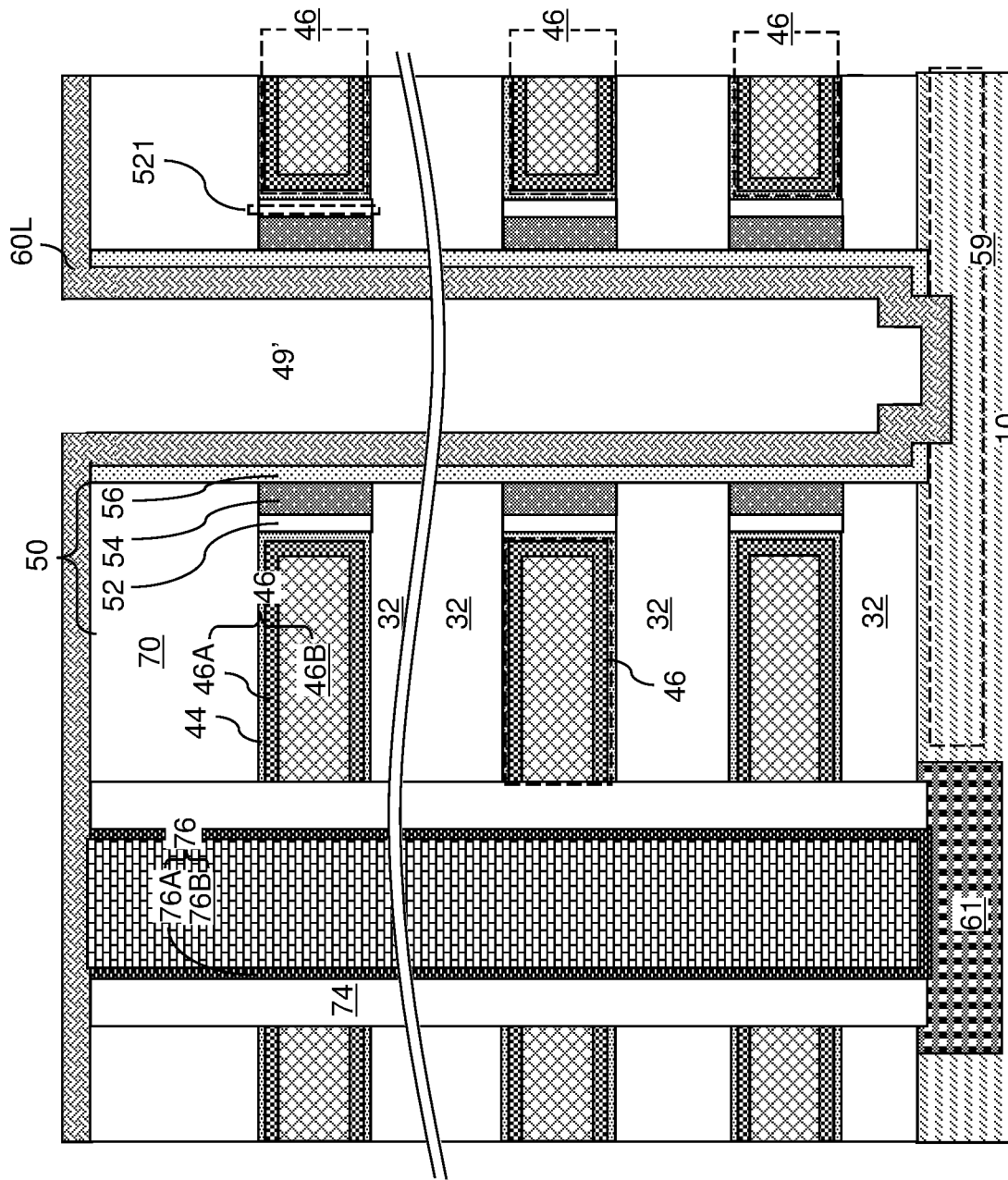

Referring to FIG. 8C, the optional sacrificial cover material layer 57, if present, can be removed selective to the material of the tunneling dielectric layer 56. In case the sacrificial cover material layer 57 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 57. A semiconductor channel layer 60L can be deposited directly on the semiconductor surface of the semiconductor material layer 10 and directly on the tunneling dielectric layer 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the sacrificial memory opening fill structures (47, 45). The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of discrete (i.e., vertically separated) silicon nitride memory elements 54, and optional blocking dielectric structures 52. An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. The memory opening fill structure 58 comprises a vertical stack of discrete silicon oxide blocking dielectric structures 52, a vertical stack of discrete silicon nitride memory elements 54, a continuous tunneling dielectric layer 56, a vertical semiconductor channel 60, an optional dielectric core 62, and a drain region 63. A tunneling dielectric layer 56 may laterally surround the vertical semiconductor channel 60.

Figure 9:
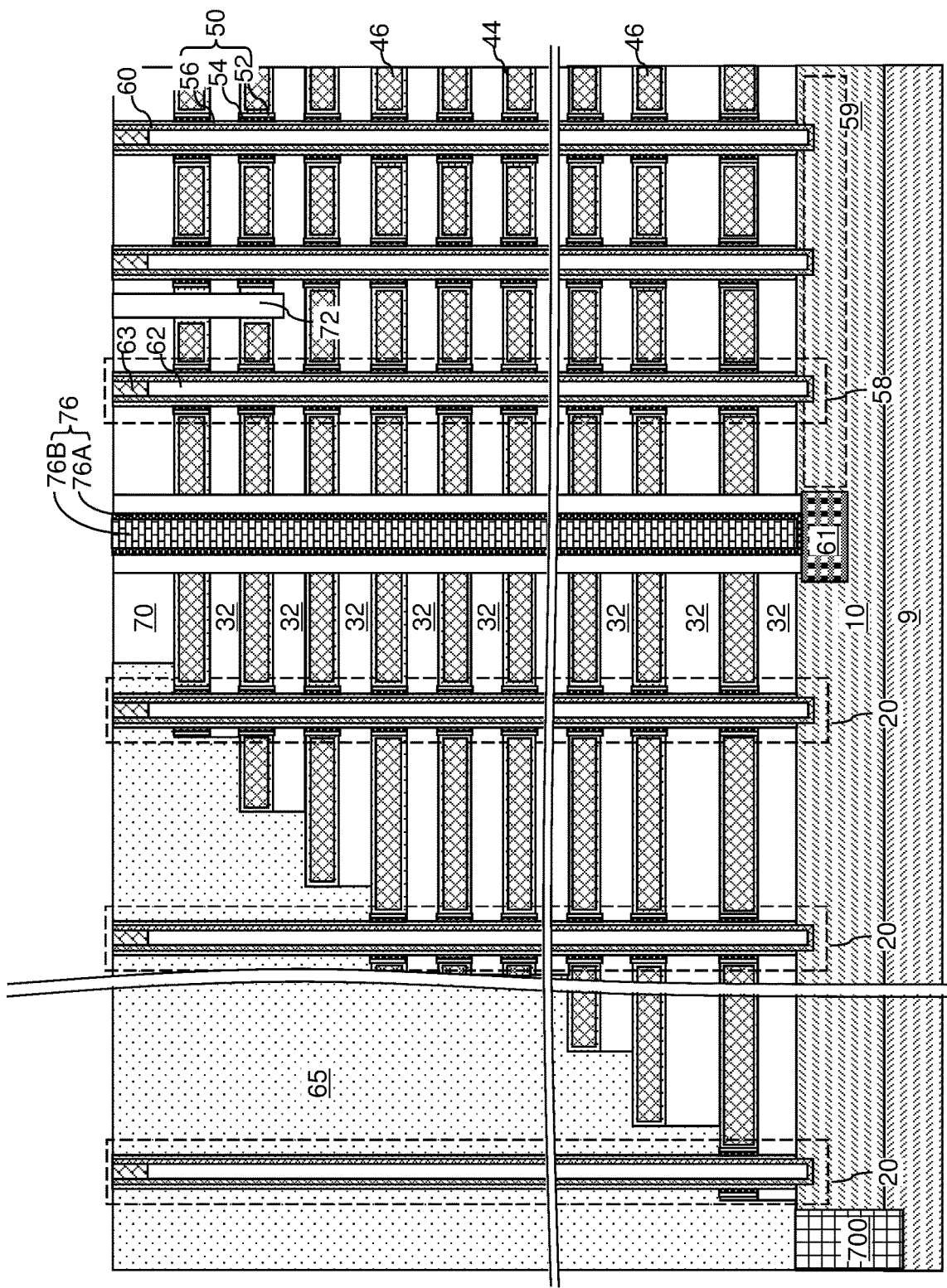
FIG. 9 is a schematic vertical cross-sectional view of the first exemplary structure after formation of the memory opening fill structures and support pillar structures according to an embodiment of the present disclosure.

Referring to FIG. 9, the first exemplary structure is illustrated after formation of memory opening fill structures 58 and support pillar structure 20 within the memory openings 49 and the support openings 19, respectively. An instance of a memory opening fill structure 58 can be formed within each memory opening 49 of the first exemplary structure of FIGS. 4A and 4B. An instance of the support pillar structure 20 can be formed within each support opening 19 of the first exemplary structure of FIGS. 4A and 4B.

Figure 10A:
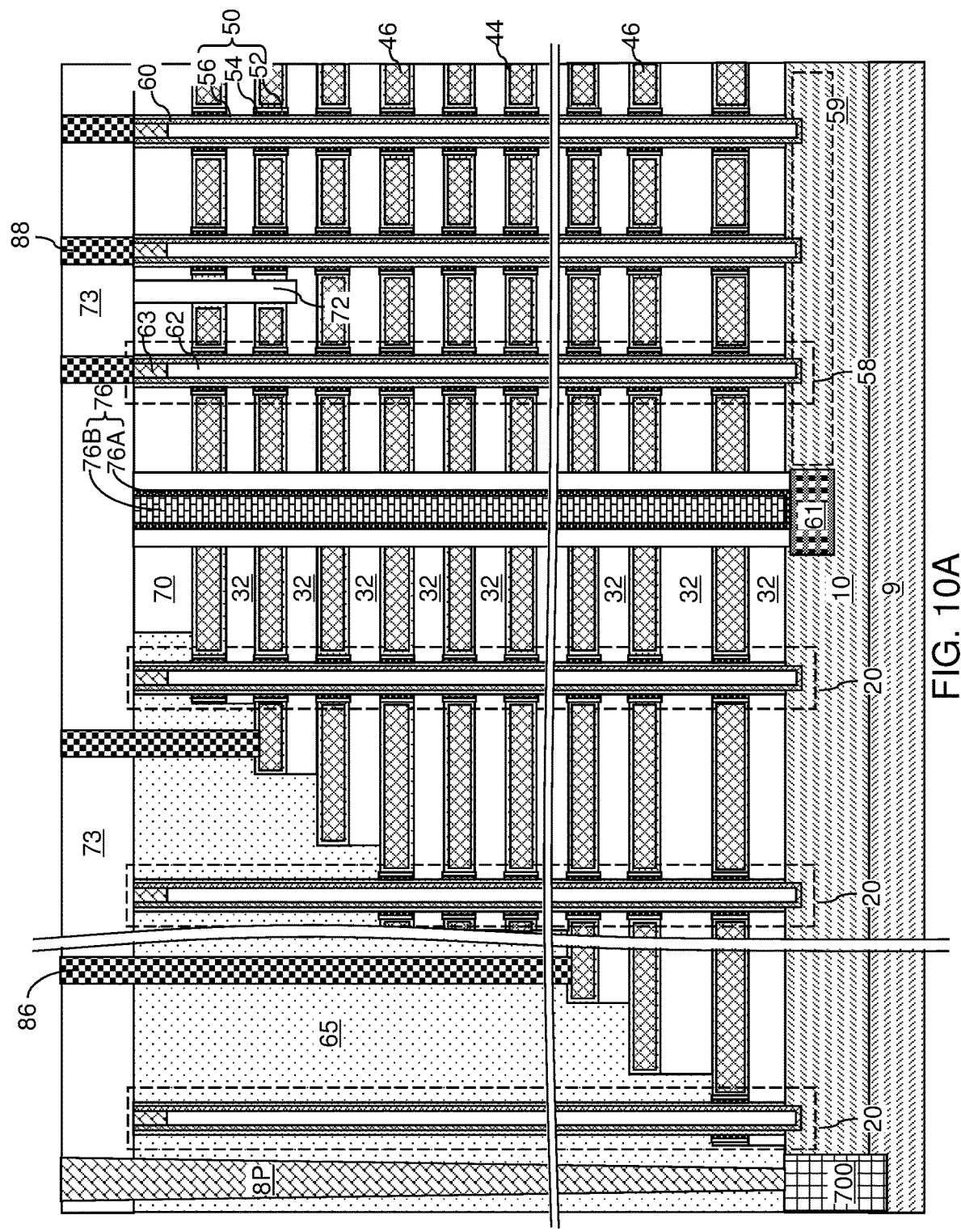
FIG. 10A is a schematic vertical cross-sectional view of the first exemplary structure after formation of additional contact via structures according to an embodiment of the present disclosure.
Figure 10B:
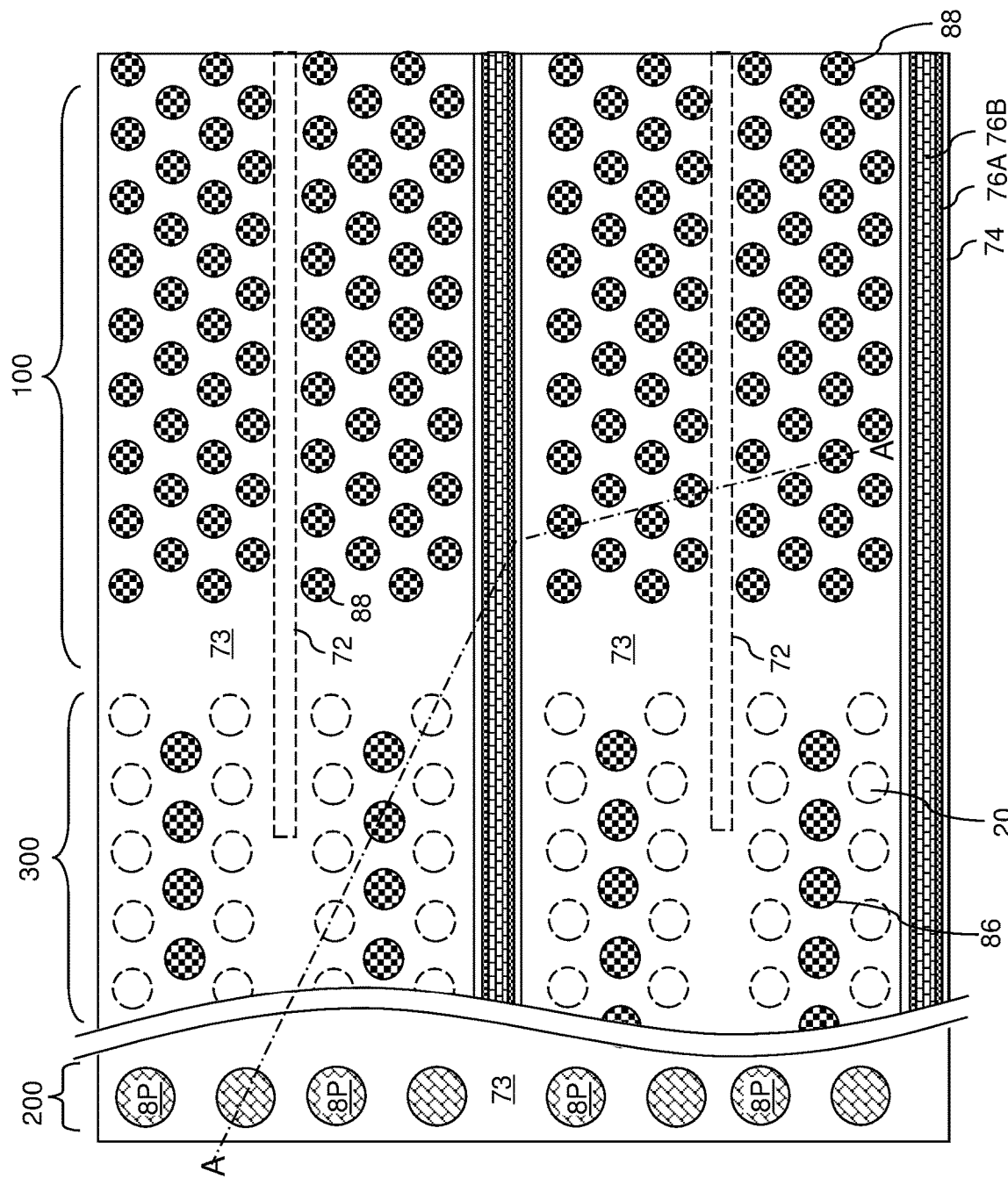
FIG. 10B is a top-down view of the first exemplary structure of FIG. 10A. The vertical plane A-A' is the plane of the schematic vertical cross-sectional view of FIG. 10A.

Referring to FIGS. 10A and 10B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

Figure 11:
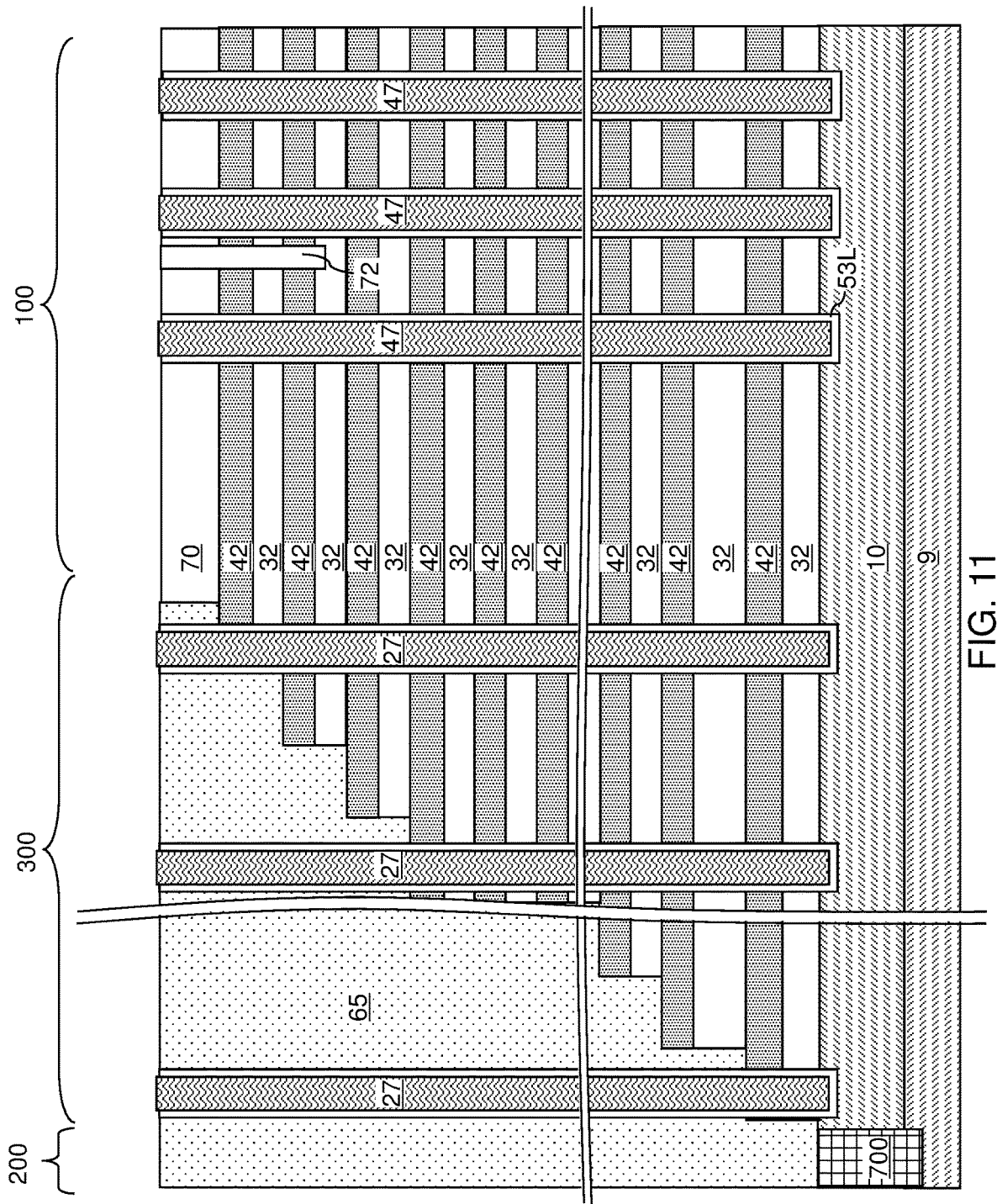
FIG. 11 is a schematic vertical cross-sectional view of a second exemplary structure after formation of sacrificial memory openings fill structures and sacrificial support opening fill structures according to an embodiment of the present disclosure.

Referring to FIG. 11, a second exemplary structure according to an embodiment of the present disclosure can be derived from the first exemplary structure illustrated in FIGS. 4A and 4B by forming a silicon oxide liner 53L in each of the memory openings 49 and the support openings 19 prior to formation of sacrificial memory opening fill material portions 47 and sacrificial support opening fill material portions 27. The silicon oxide liners 53L can be formed by conformal deposition of a silicon oxide material, for example, by chemical vapor deposition (CVD). The thickness of the silicon oxide liners 53L may be in a range from 2 nm to 20 nm, such as from 4 nm to 10 nm, although lesser and greater thicknesses may also be employed. Each sacrificial memory opening fill structure (47, 53L) comprises a combination of a silicon oxide liner 53L and a sacrificial memory opening fill material portion 47. Each sacrificial support opening fill structure (27, 53L) comprises a combination of a silicon oxide liner 53L and a sacrificial support opening fill material portion 27.

FIGS. 12A-12G are sequential vertical cross-sectional views of a region of the second exemplary structure that includes a memory opening 49 and a backside trench 79 during formation of electrically conductive layers 46 and backside trench fill structures (74, 76).

Figure 12A:
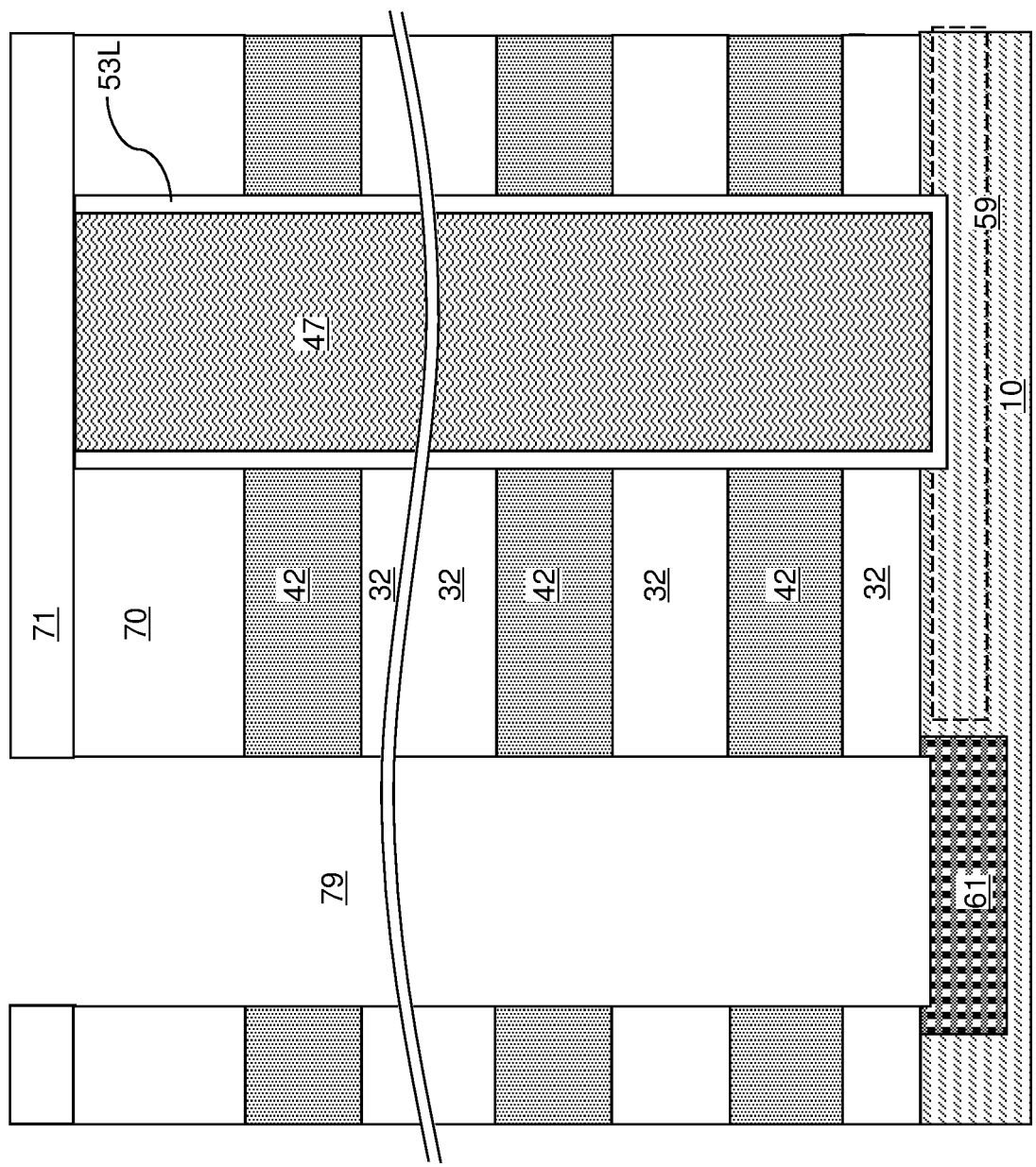
FIGS. 12A-12G are sequential vertical cross-sectional views of a region of the second exemplary structure that includes a memory opening and a backside trench during formation of electrically conductive layers and backside trench fill structures.

Referring to FIG. 12A, the processing steps of FIGS. 6A-6C can be performed to form a sacrificial capping dielectric layer 71, backside trenches 79, and optional source regions 61.

Figure 12B:
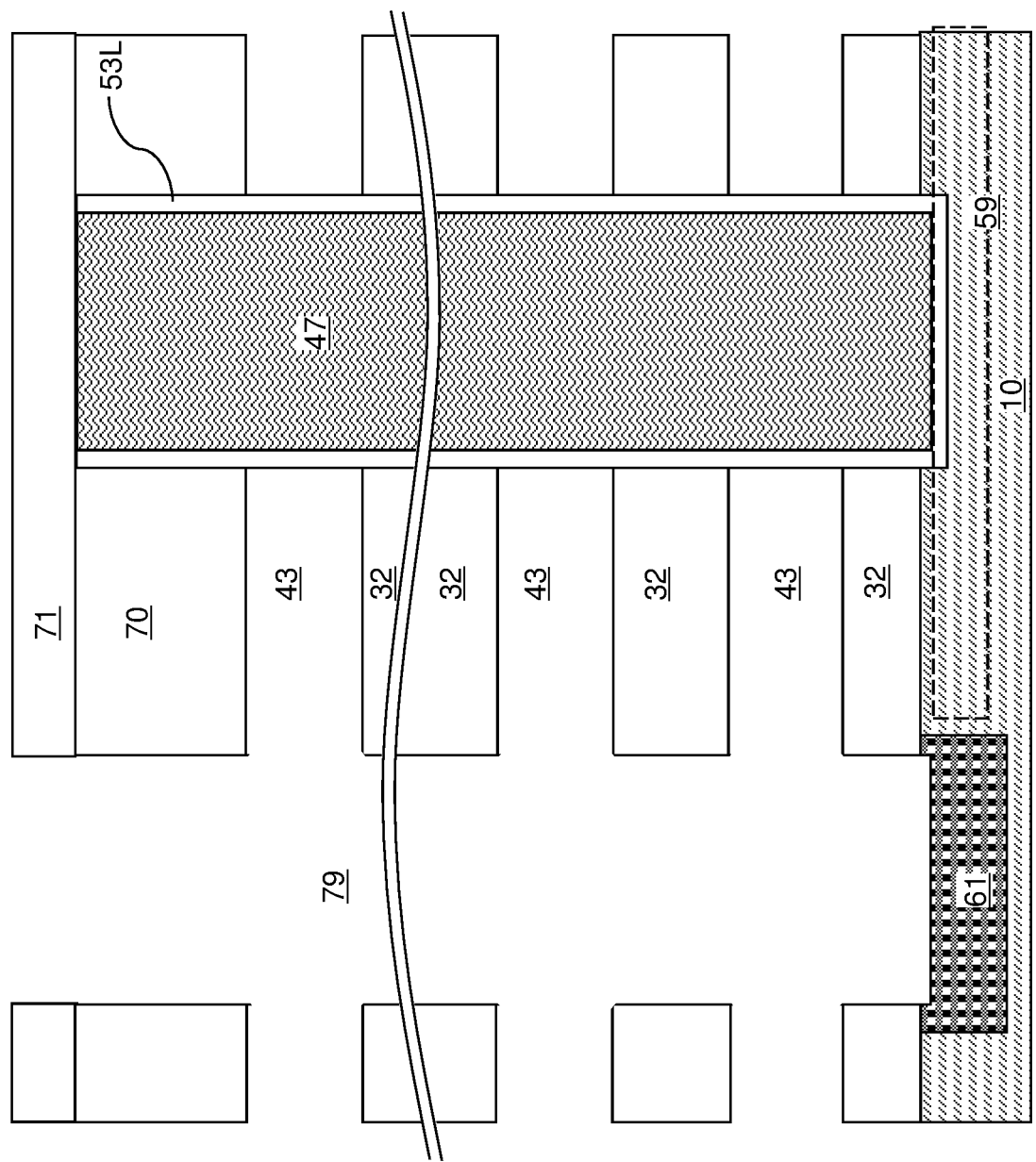

Referring to FIG. 12B, the processing steps of FIG. 7A can be performed to remove the sacrificial material layers 42 selective to the insulating layers 32, the retro-stepped dielectric material portion 65, and the silicon oxide liners 53L of the sacrificial memory opening fill structure (47, 53L) and the sacrificial support opening fill structure (27, 53L). Backside recesses 43 are formed in volumes from which the sacrificial material layers 42 are removed.

Figure 12C:
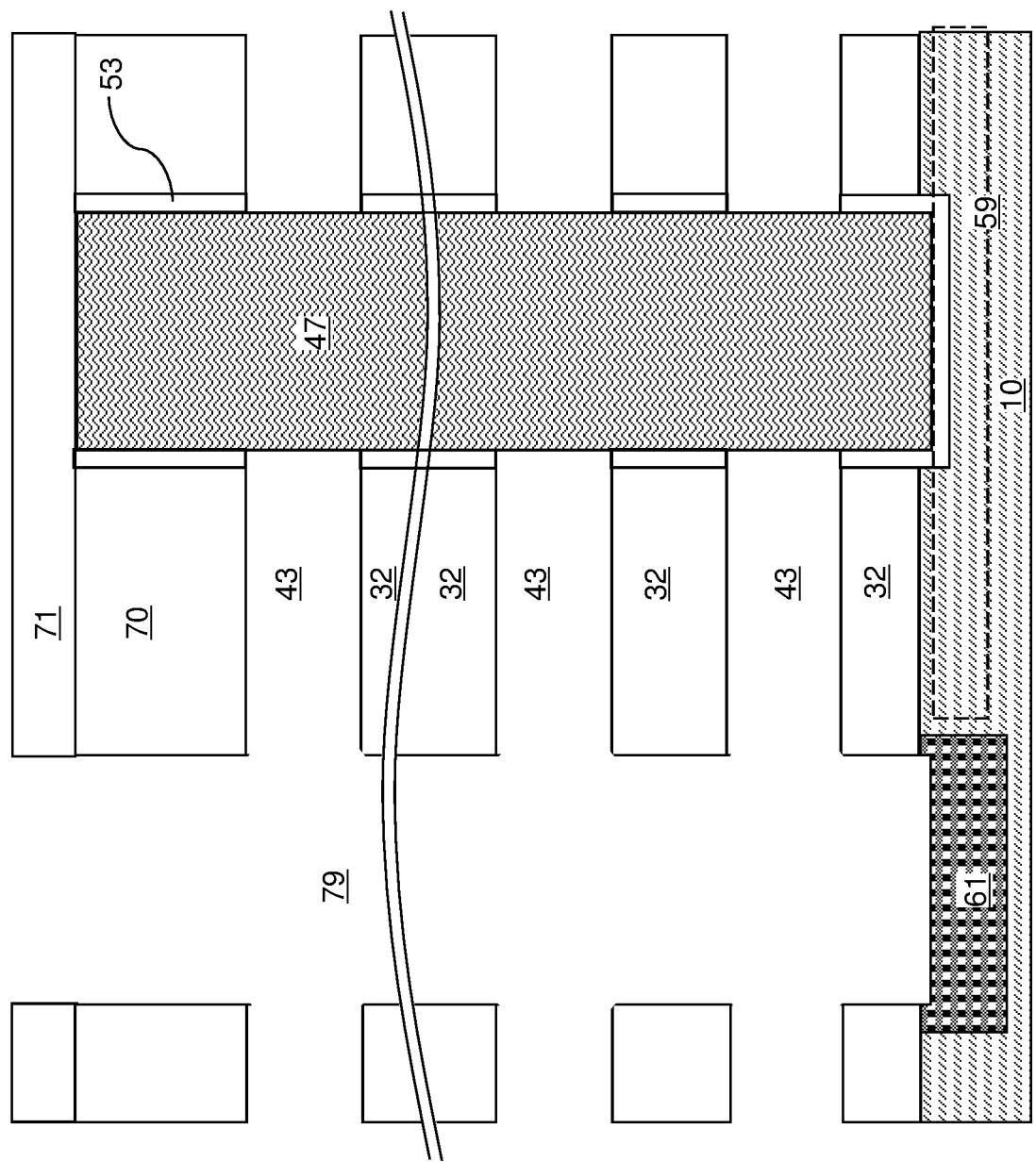

Referring to FIG. 12C, an isotropic etch process can be performed to remove cylindrical segments of the silicon oxide liners 53L that are physically exposed to the backside recesses 43. The cylindrical segments of the silicon oxide liners 53L are removed through the backside recesses 43 after formation of the backside recesses 43. Cylindrical surface segments of the sacrificial memory opening fill material portions 47 and the sacrificial support opening fill material portions 27 are physically exposed. Remaining portions of each silicon oxide liner 53L comprise a vertical stack of discrete silicon oxide spacers 53. Each silicon oxide spacer 53 can have a tubular configuration, and can contact a cylindrical sidewall of a respective one of the insulating layers 32 or the insulating cap layer 70.

Figure 12D:
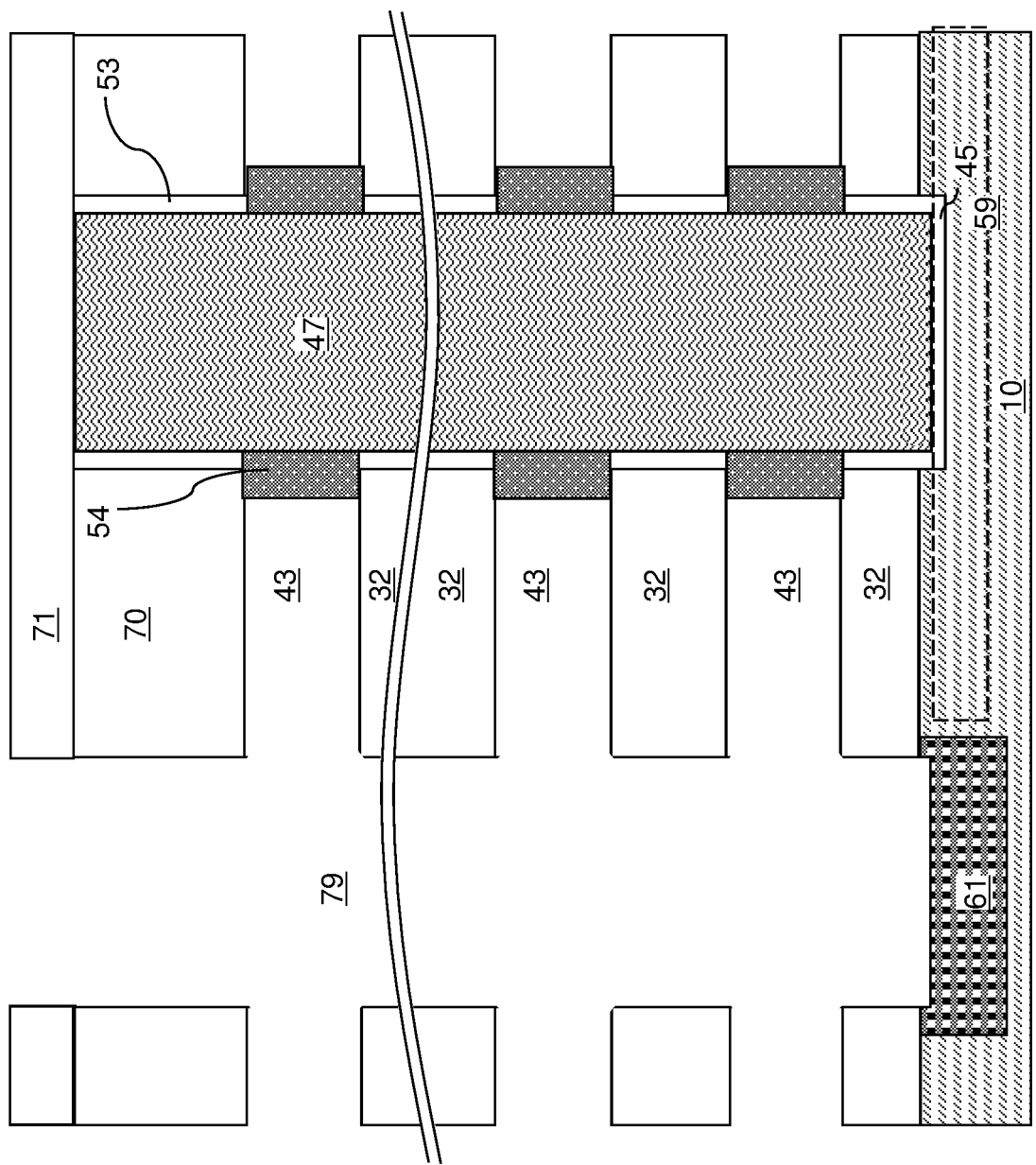

Referring to FIG. 12D, the processing steps of FIG. 7B can be performed to form a vertical stack of silicon nitride memory elements 54 on physically exposed surface segments of each sacrificial memory opening fill material portion 47. A vertical stack of silicon nitride memory elements 54 may be formed on physically exposed surface segments of one or more of the sacrificial support opening fill material portions 27.

Figure 12E:
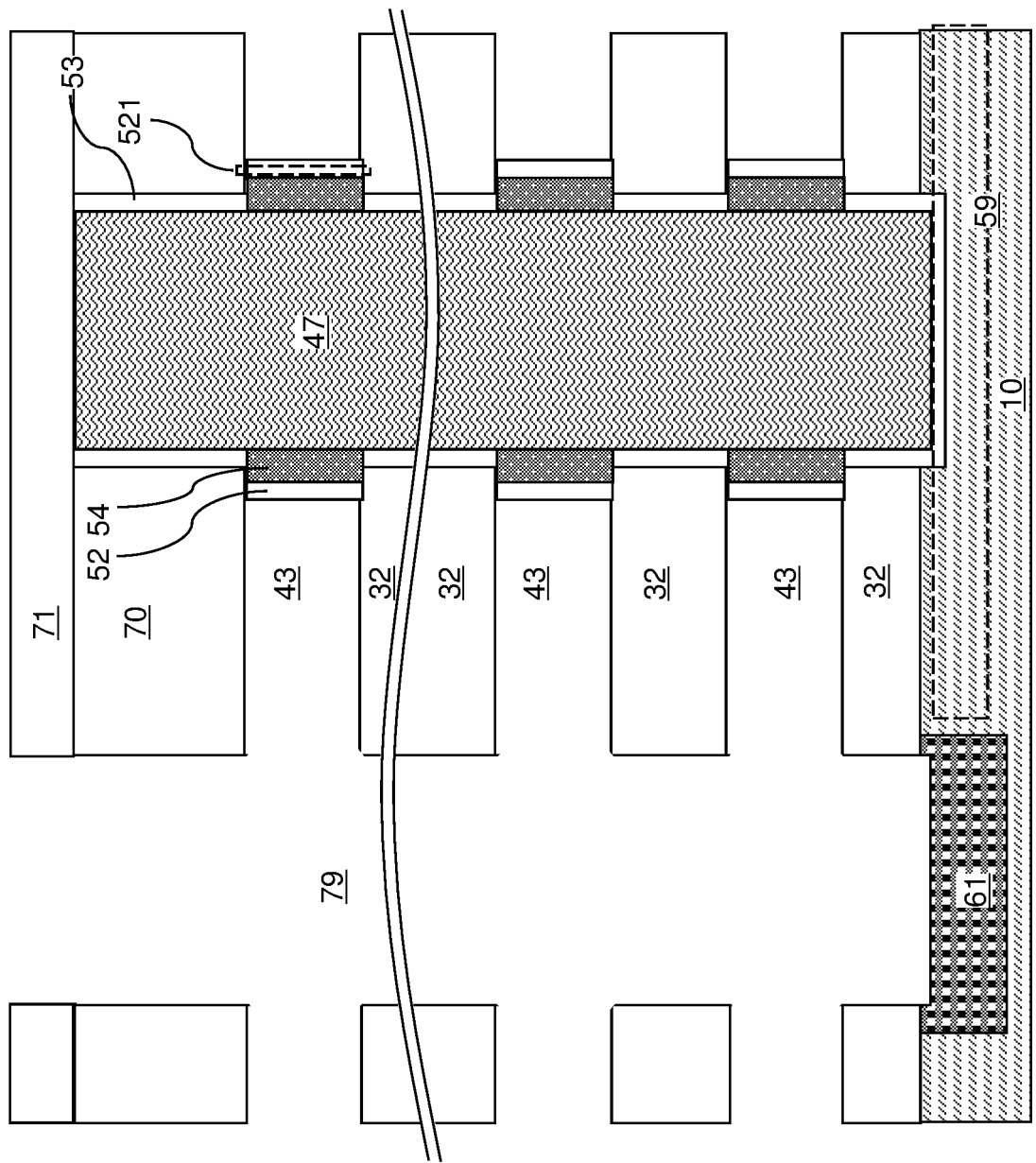

Referring to FIG. 12E, the processing steps of FIG. 7C can be performed to convert outer surface portions of the silicon nitride memory elements 54 into silicon oxide material portions, which are herein referred to as silicon oxide blocking dielectric structures 52. In one embodiment, the silicon oxide blocking dielectric structures 52 may have a material composition of $SiO_{2-\delta}N_{2\delta/3}$, in which $\delta$ is in a range from 0 to 1. In one embodiment, the value of $\delta$ may be 0 at an outer sidewall of each silicon oxide blocking dielectric structure 52, and may be 1 at an interface with a silicon nitride memory element 54.

Figure 12F:
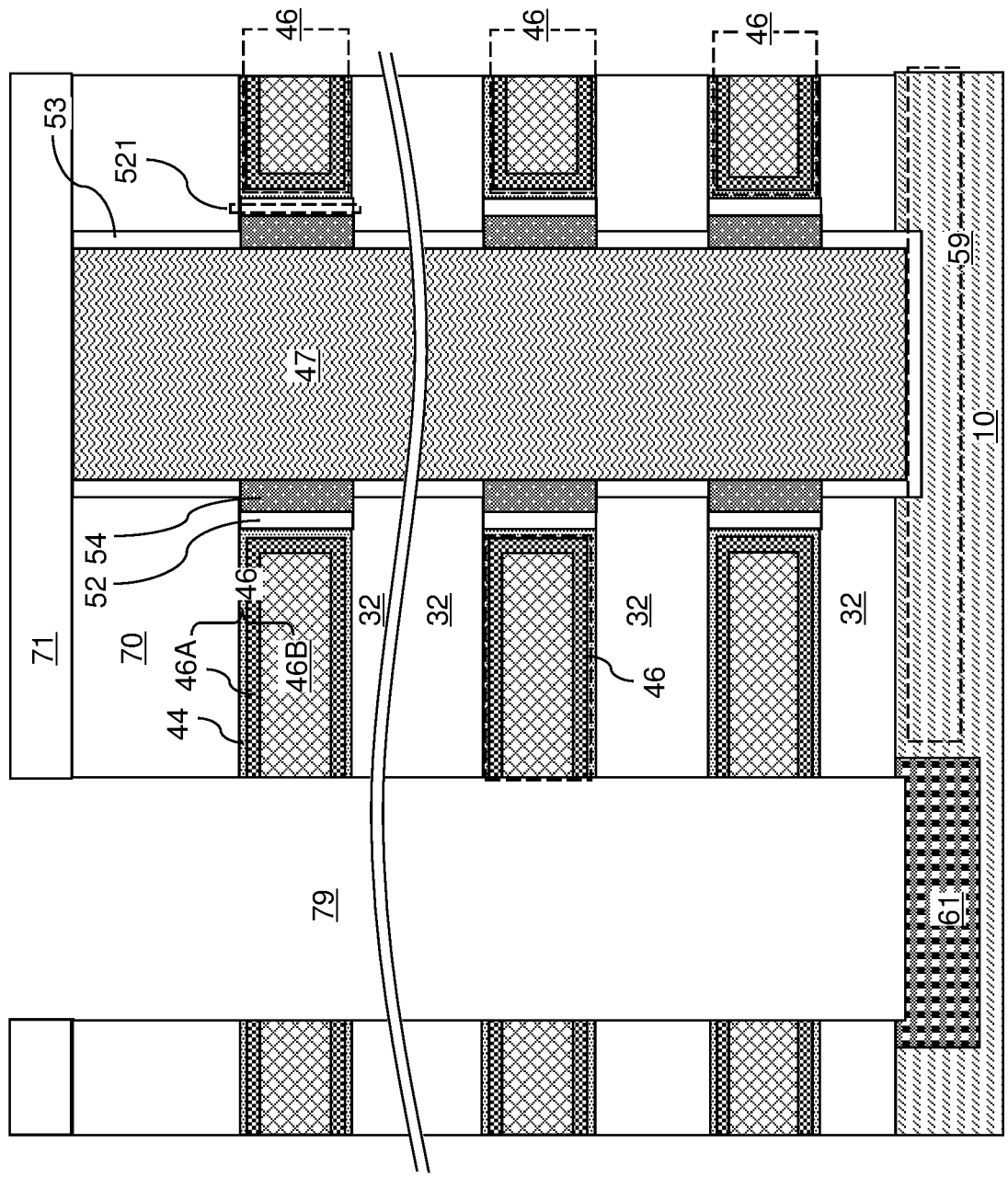

Referring to FIG. 12F, the processing steps of FIG. 7D can be performed to form backside blocking dielectric layers 44 and electrically conductive layers 46.

Figure 12G:
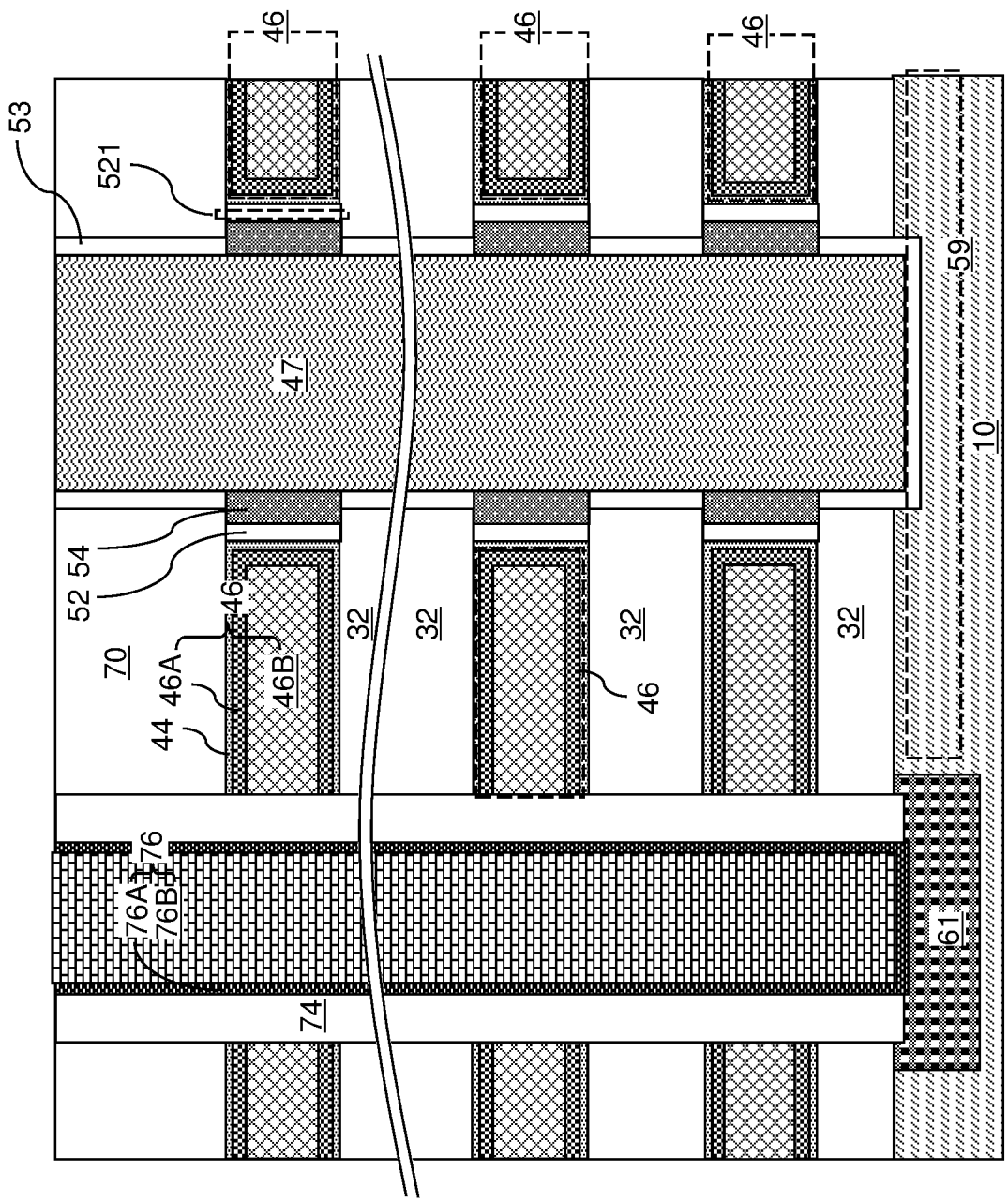

Referring to FIG. 12G, the processing steps of FIG. 7E can be performed to form a backside trench fill structure (74, 76) in each of the backside trenches 79.

FIGS. 13A-13D are sequential vertical cross-sectional views of a region of the second exemplary structure that includes a memory opening 49 and a backside trench 79 during replacement of sacrificial memory opening fill material portions 47 with memory opening fill structures 58.

Figure 13A:
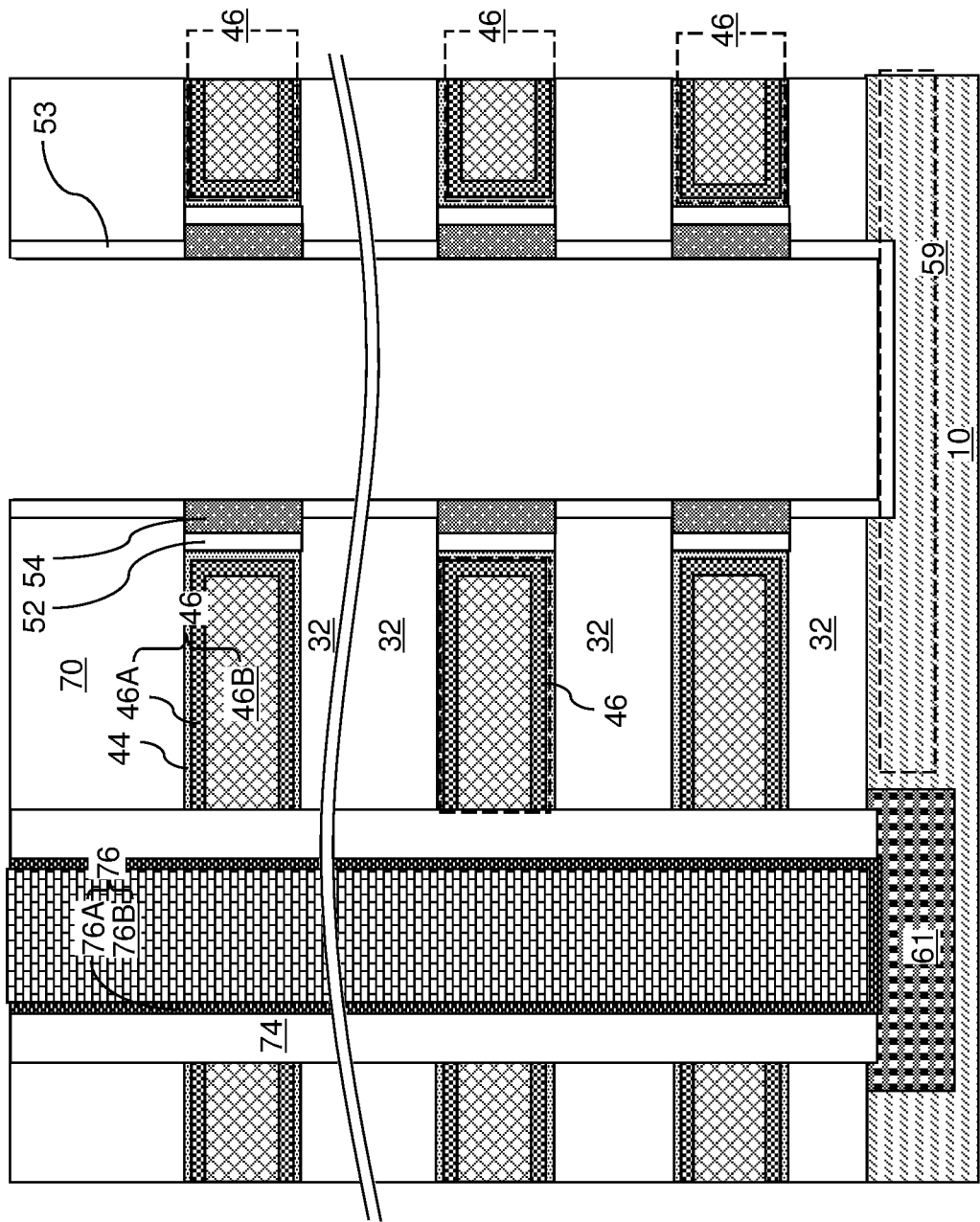
FIGS. 13A-13D are sequential vertical cross-sectional views of a region of the second exemplary structure that includes a memory opening and a backside trench during replacement of sacrificial memory opening fill material portions with memory opening fill structures.

Referring to FIG. 13A, the processing steps of FIG. 8A can be performed to remove the sacrificial memory opening fill material portions 47 and the sacrificial support opening fill material portions 27 selective to the silicon oxide spacers 53.

Figure 13B:
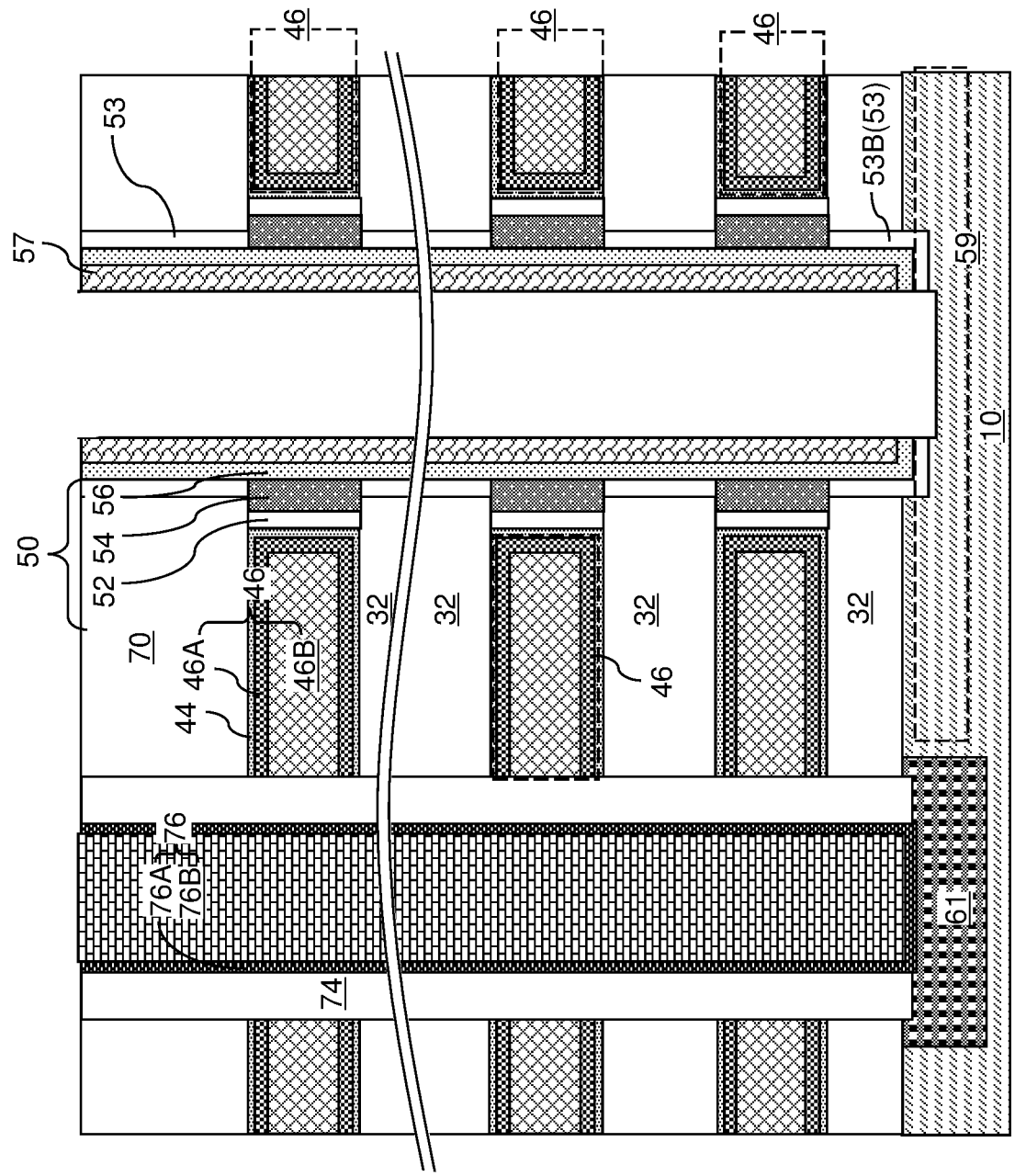

Referring to FIG. 13B, the processing steps of FIG. 8B can be performed to form a tunneling dielectric layer 56 and an optional sacrificial cover material layer 57 in each of the memory openings 49 and the support openings 19. An anisotropic etch process can be performed to remove horizontally-extending portions of the optional sacrificial cover material layer 57 and the tunneling dielectric layer 56. The anisotropic etch process can be prolonged to remove a portion of a bottommost silicon oxide spacer 53B within each memory opening 49 and within each support opening 19. A surface of the semiconductor material layer 10 can be physically exposed at the bottom of each memory opening 49.

Figure 13C:
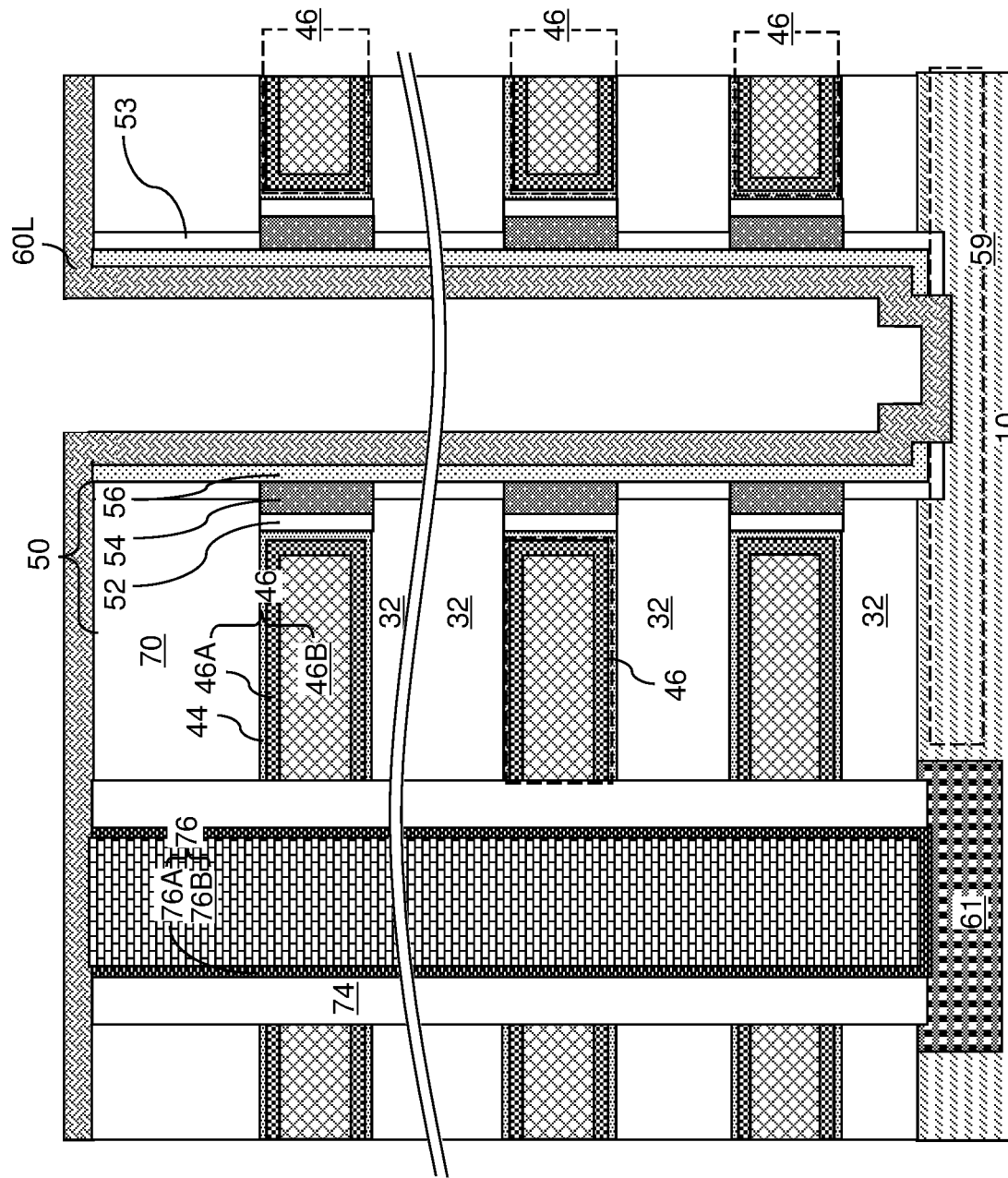

Referring to FIG. 13C, the processing steps of FIG. 8C can be performed to remove the sacrificial cover material layer 57, and to deposit the semiconductor channel layer 60L.

Figure 8D:
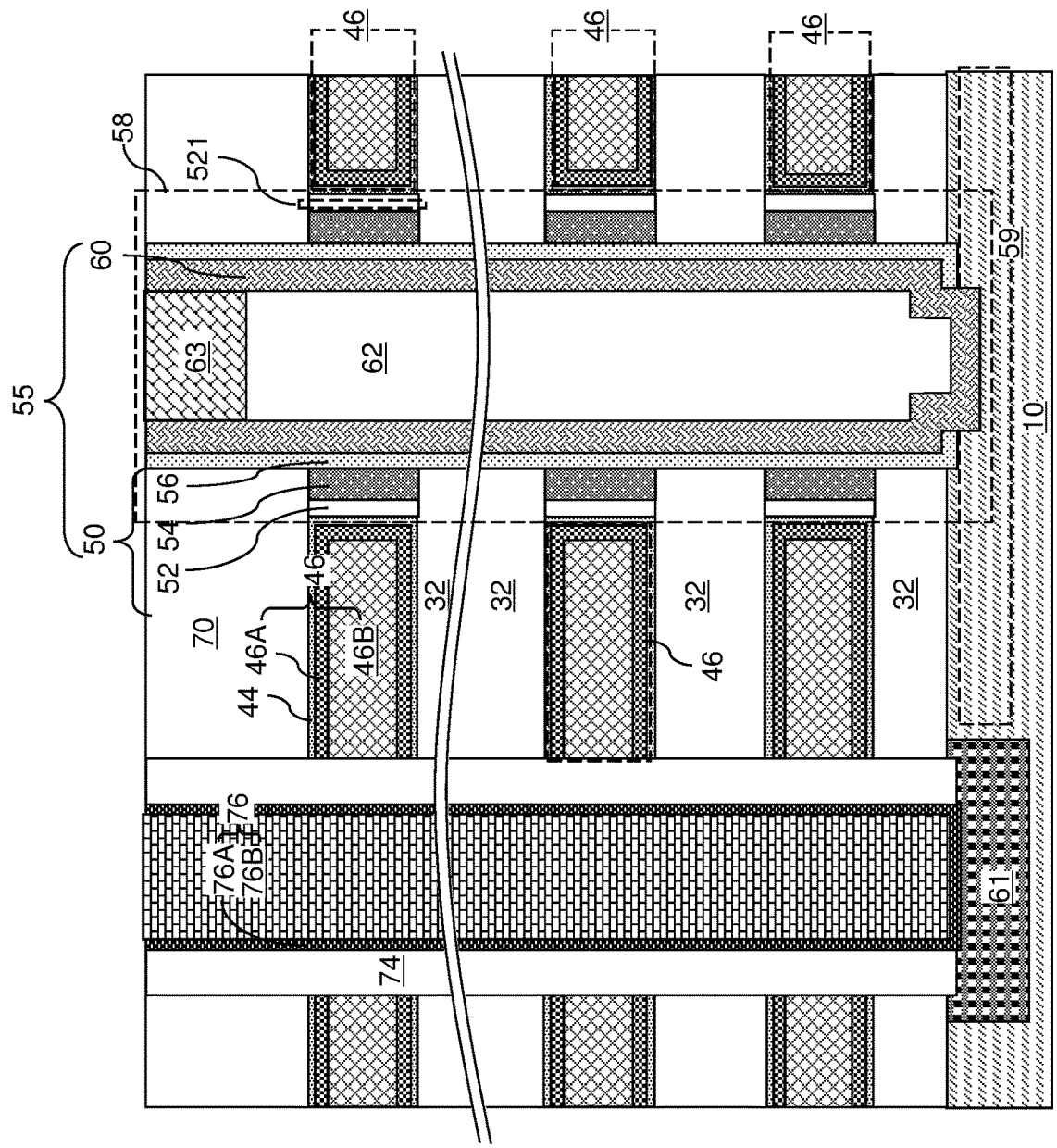
Figure 13D:
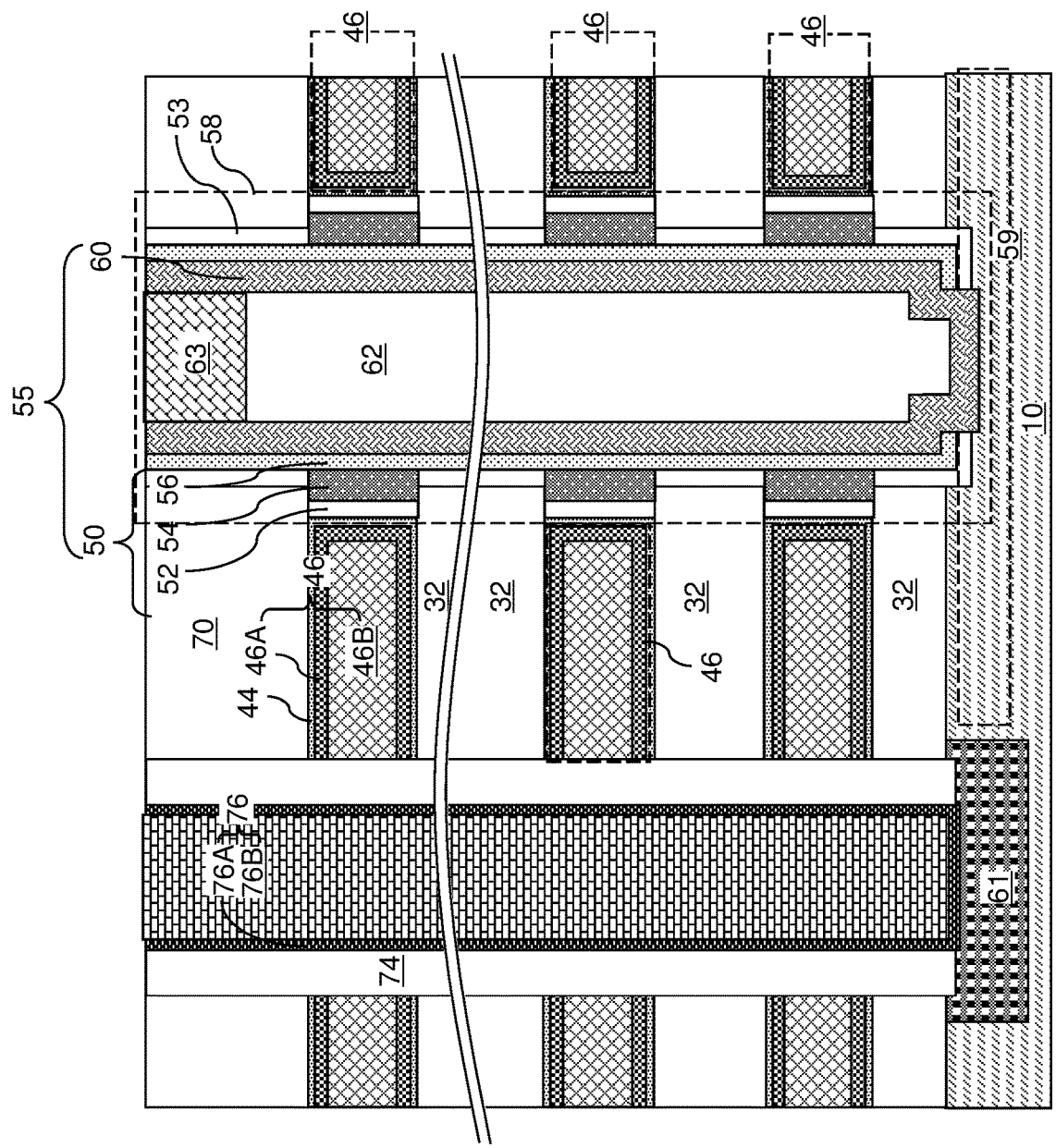

Referring to FIG. 13D, the processing steps of FIG. 8D can be performed to form a vertical semiconductor channel 60, a dielectric core 62, and a drain region 63 in each of the memory openings 49 and the support openings 19. A memory opening fill structure 58 is formed in each memory opening 49, and a support pillar structure 20 is formed in each support opening 19.

Subsequently, the processing steps of FIGS. 9, 10A, and 10B can be performed to form a contact-level dielectric layer 73 and various contact via structures (86, 88, 8P).

Figure 14A:
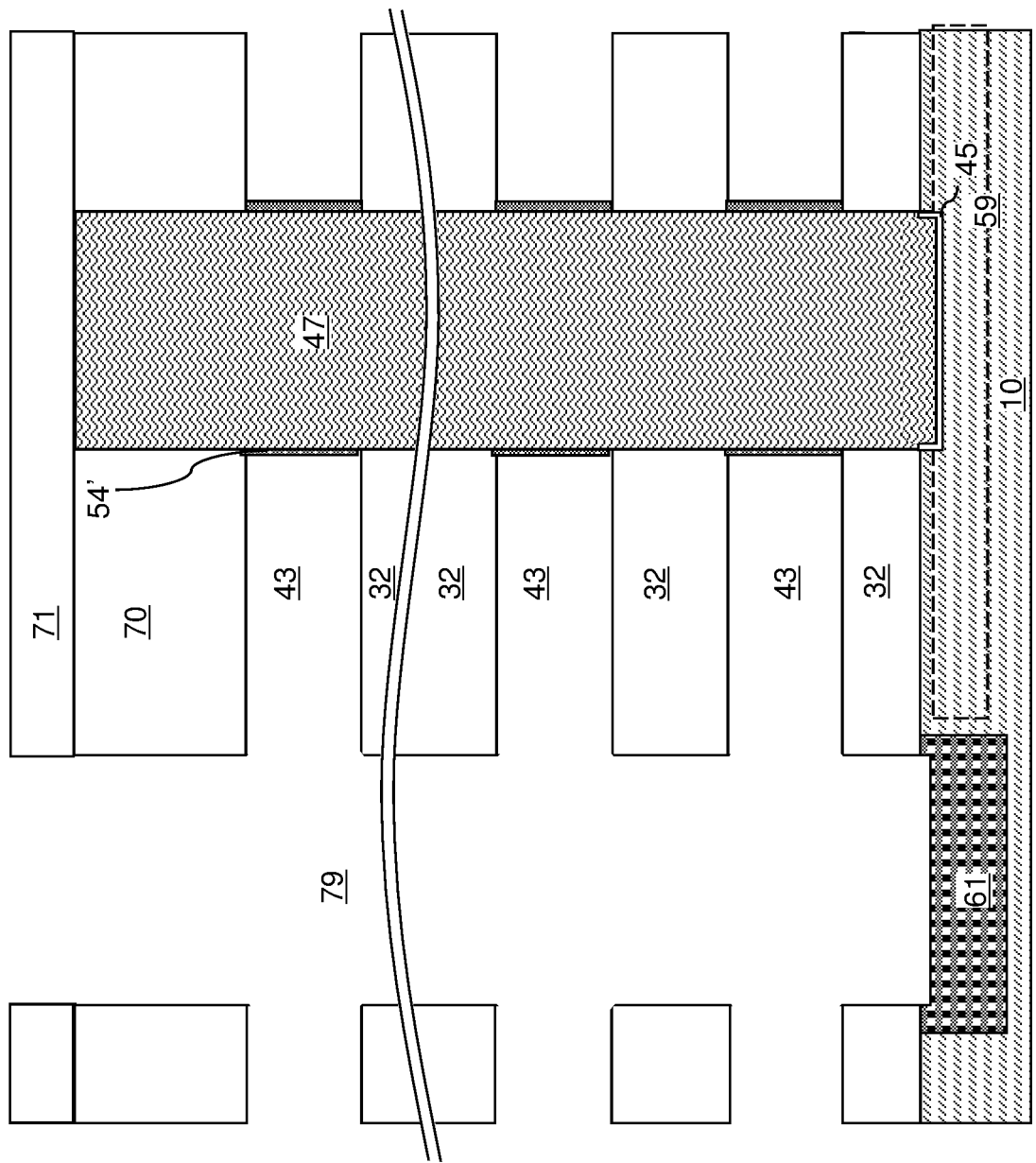
FIGS. 14A-14C are sequential vertical cross-sectional views of a region of a third exemplary structure that includes a memory opening and a backside trench during formation of electrically conductive layers and backside trench fill structures.
Figure 14B:
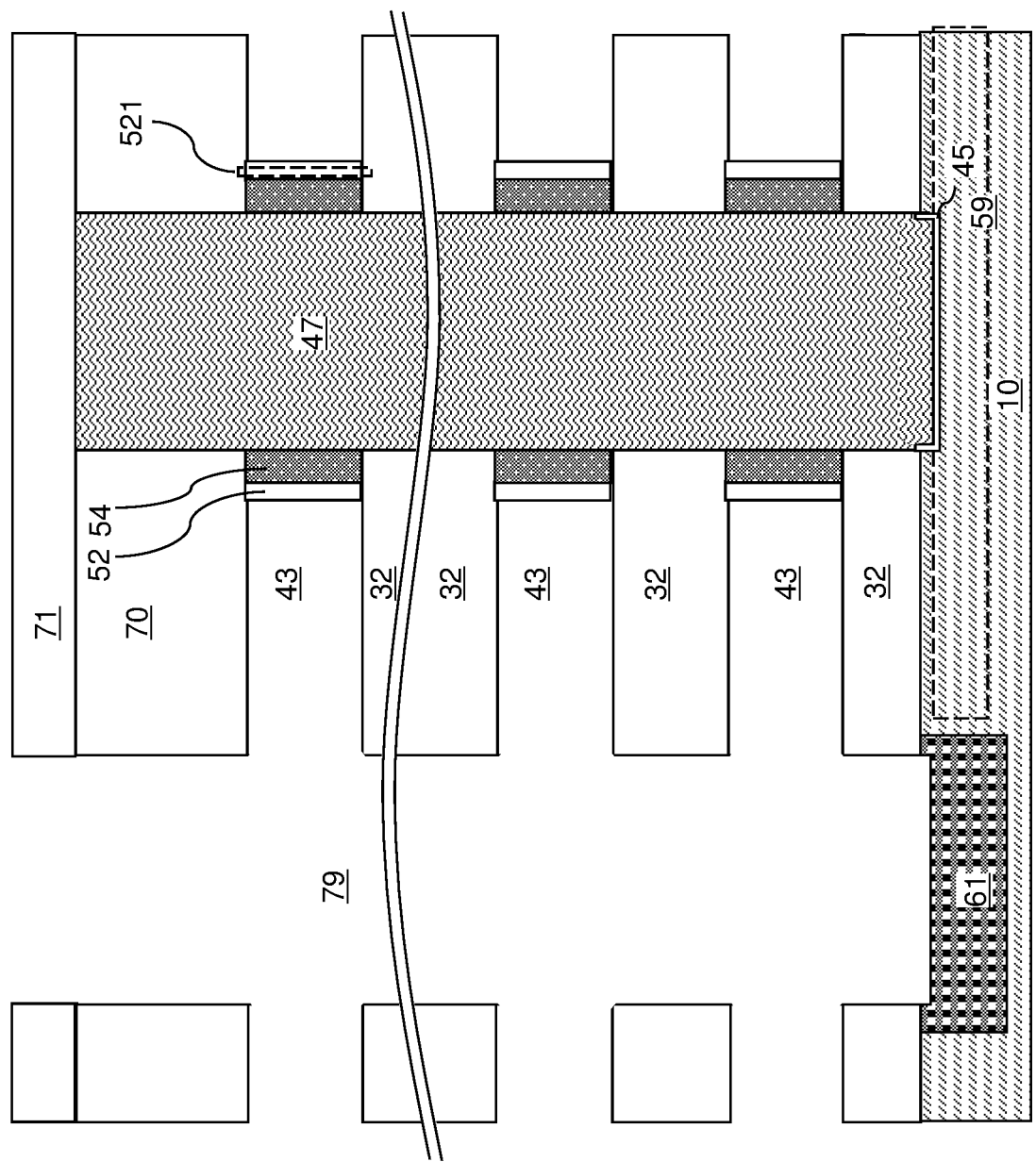
Figure 14C:
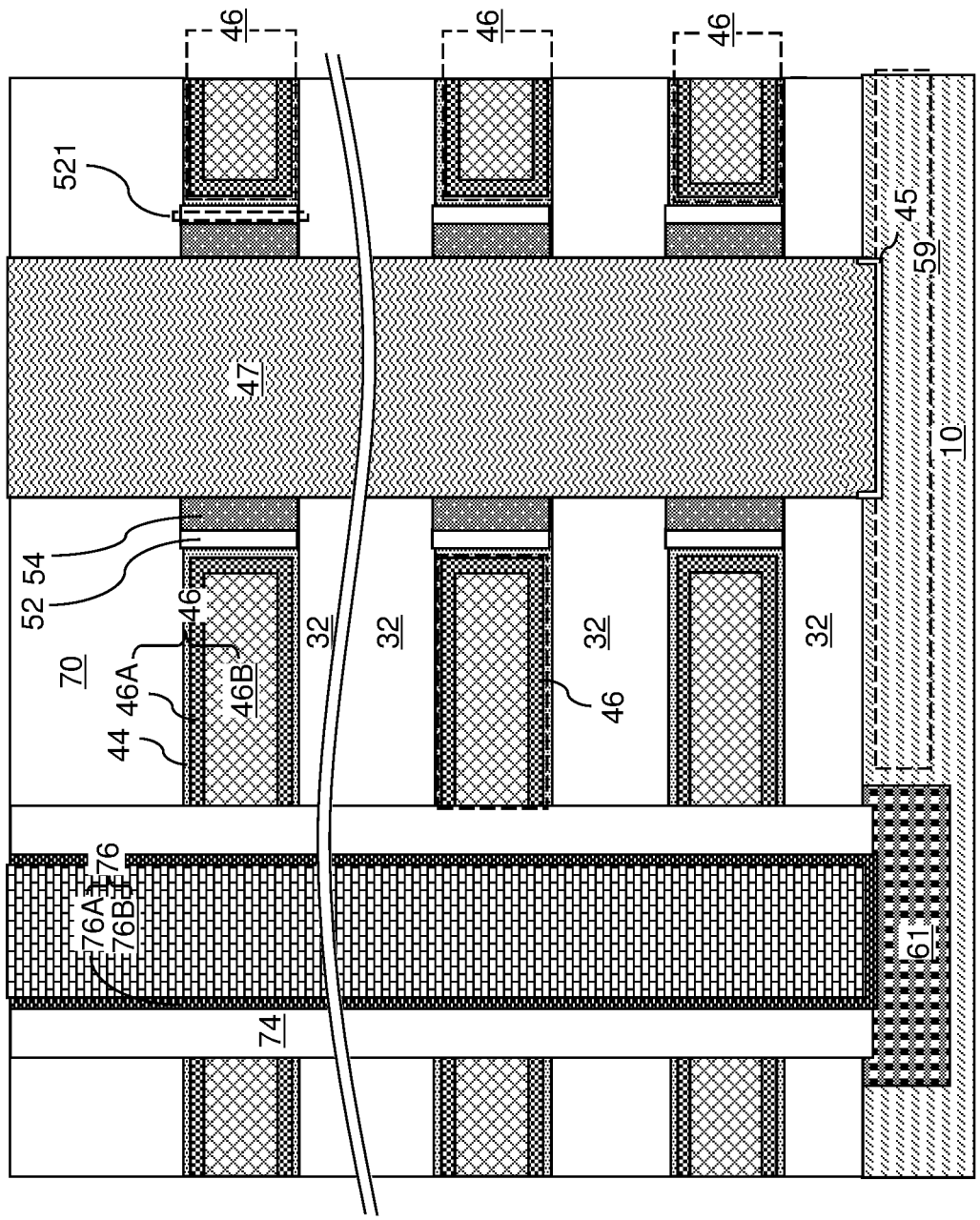

FIGS. 14A-14C are sequential vertical cross-sectional views of a region of a third exemplary structure that includes a memory opening 49 and a backside trench 79 during formation of electrically conductive layers 46 and backside trench fill structures (74, 76).

Referring to FIG. 14, the third exemplary structure can be derived from the first exemplary structure of FIG. 7A or from the second exemplary structure of FIG. 12C by performing a nitridation process that forms a vertical stack of silicon nitride liners 54' on physically exposed cylindrical surface segments of each of the sacrificial memory opening fill material portions 47 and the sacrificial support opening fill material portions 27. The nitridation process may comprise a thermal or plasma nitridation process in which a nitrogen containing ambient, such as nitrogen gas or ammonia are provided into the backside recesses 43 through the backside trench 79. In one embodiment, the insulating layers 32 comprise a silicon oxide material, and the sacrificial memory opening fill material portions 47 comprises a semiconductor material, such as amorphous silicon. The surfaces of the amorphous silicon portions 47 exposed in the backside recesses 43 are converted into the discrete silicon nitride liners 54'.

Referring to FIG. 14B, the processing steps of FIG. 7B can be performed to form a vertical stack of silicon nitride memory elements 54 around each sacrificial memory opening fill material portion 47. In this case, the silicon nitride liners 54' can be employed as growth templates for the selective silicon nitride deposition process. Generally, the vertical stacks of silicon nitride memory elements 54 can be formed by performing a nitridation process that converts surface portions of the semiconductor material into silicon nitride liners 54', and by performing a selective silicon nitride deposition process (e.g., CVD or ALD) that grows a silicon nitride material from physically exposed surfaces of the silicon nitride liners 54' while suppressing growth of the silicon nitride material from surfaces of the silicon oxide material of the insulating layers 32 and the insulating cap layer 70.

Subsequently, the processing steps of FIG. 7C can be performed to convert outer surface portions of the silicon nitride memory elements 54 into silicon oxide blocking dielectric structures 52. In one embodiment, the silicon oxide blocking dielectric structures 52 may have a material composition of $SiO_{2-\delta}N_{2\delta/3}$, in which $\delta$ is in a range from 0 to 1. In one embodiment, the value of $\delta$ may be 0 at an outer sidewall of each silicon oxide blocking dielectric structure 52, and may be 1 at an interface with a silicon nitride memory element 54.

Referring to FIG. 14C, the processing steps of FIGS. 7D and 7E can be performed to form backside blocking dielectric layers 44, electrically conductive layers 46, and backside trench fill structures (74, 76).

Figure 15:
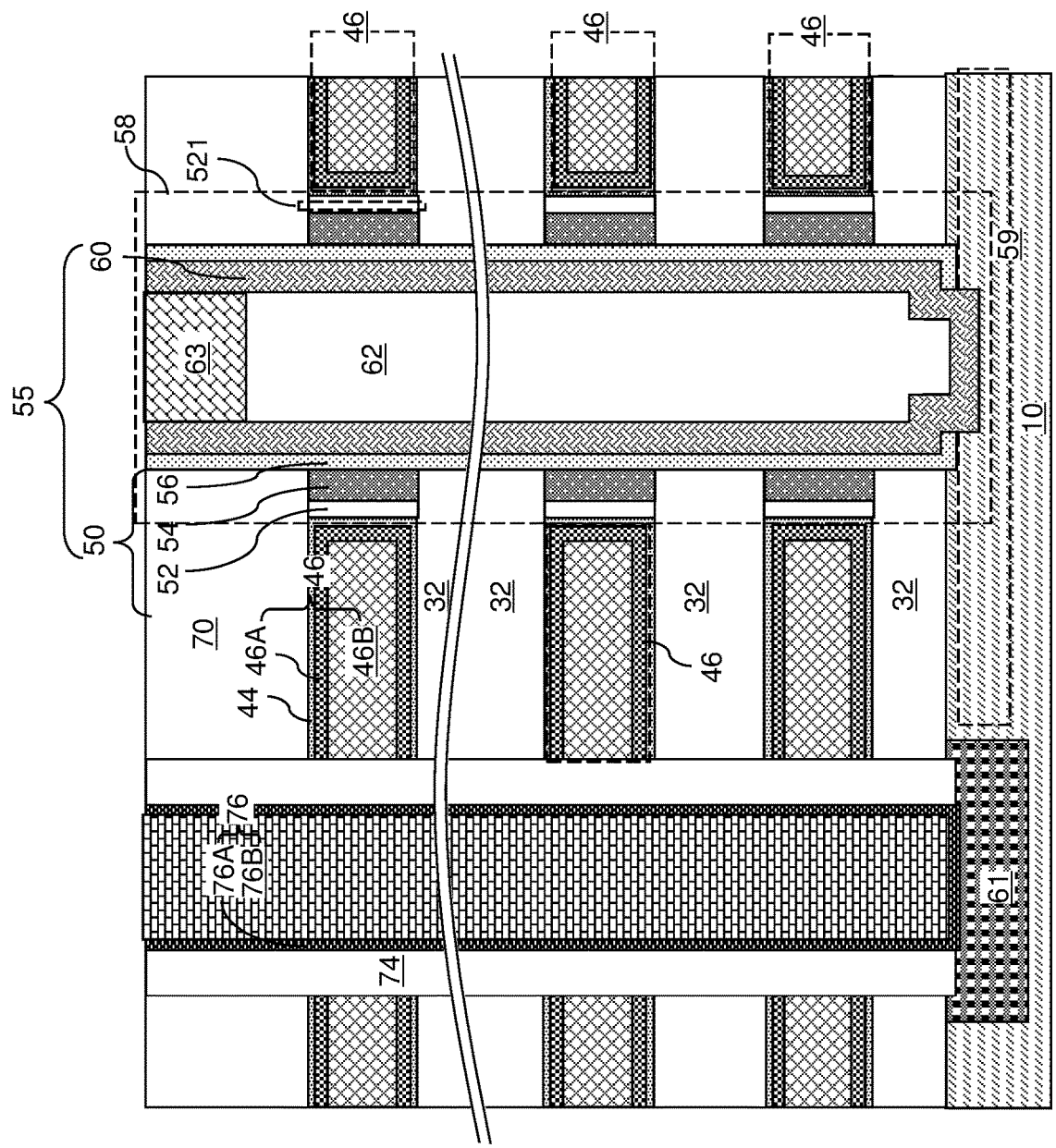
FIG. 15 is a vertical cross-sectional views of a region of the third exemplary structure that includes a memory opening and a backside trench after replacement of sacrificial memory opening fill structures with memory opening fill structures.

Referring to FIG. 15, the processing steps of FIGS. 8A-8D can be performed to replace the sacrificial memory opening fill structures (47, 45) with memory opening fill structures 58 and to replace the sacrificial support opening fill structures (27, 45) with support pillar structures 20. Subsequently, the processing steps of FIGS. 9, 10A, and 10B can be performed to form a contact-level dielectric layer 73 and various contact via structures (86, 88, 8P).

Figure 16A:
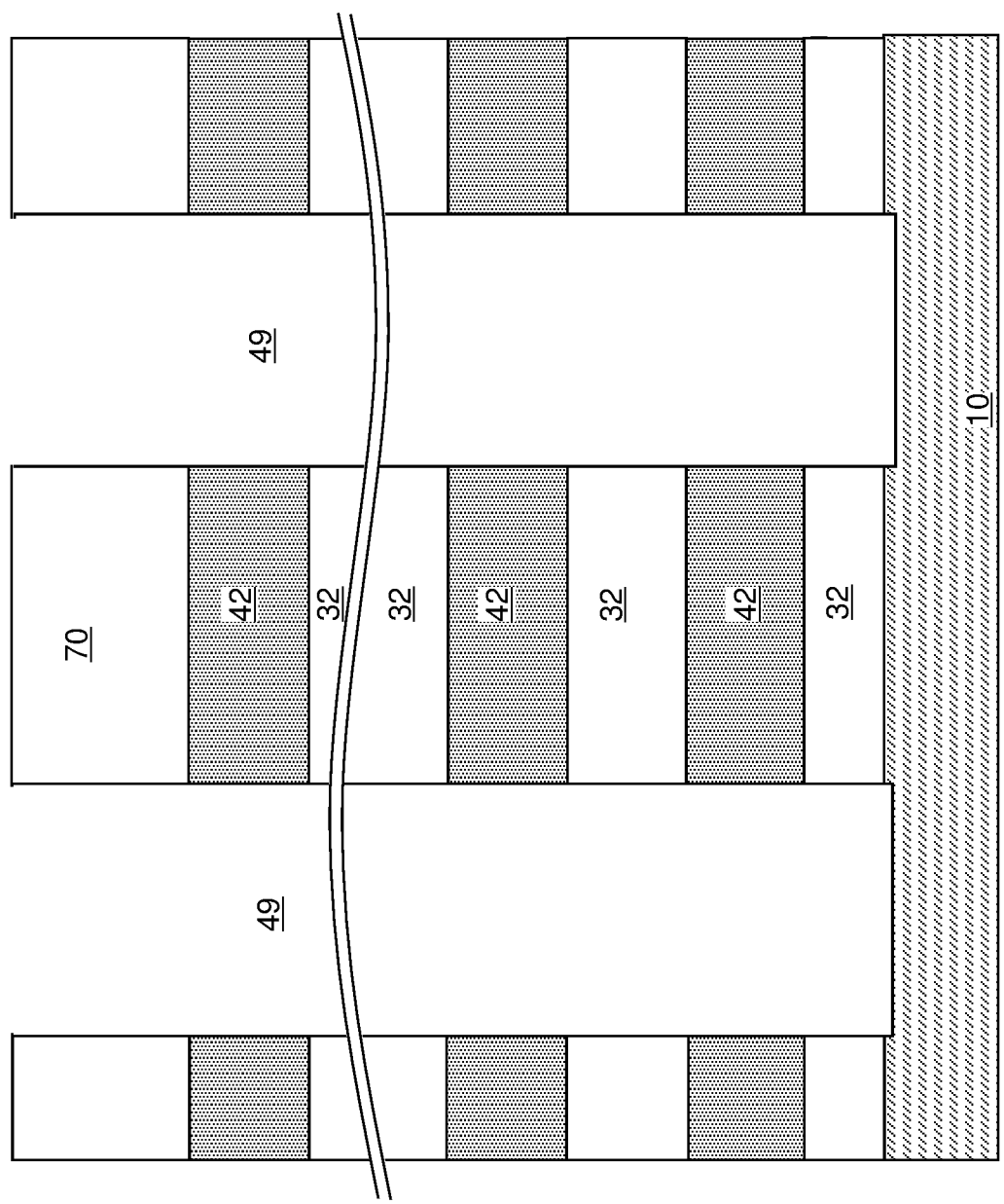
FIGS. 16A-16C are sequential vertical cross-sectional views of a memory opening of a fourth exemplary structure during formation of a sacrificial memory opening fill structure according to an embodiment of the present disclosure.
Figure 16B:
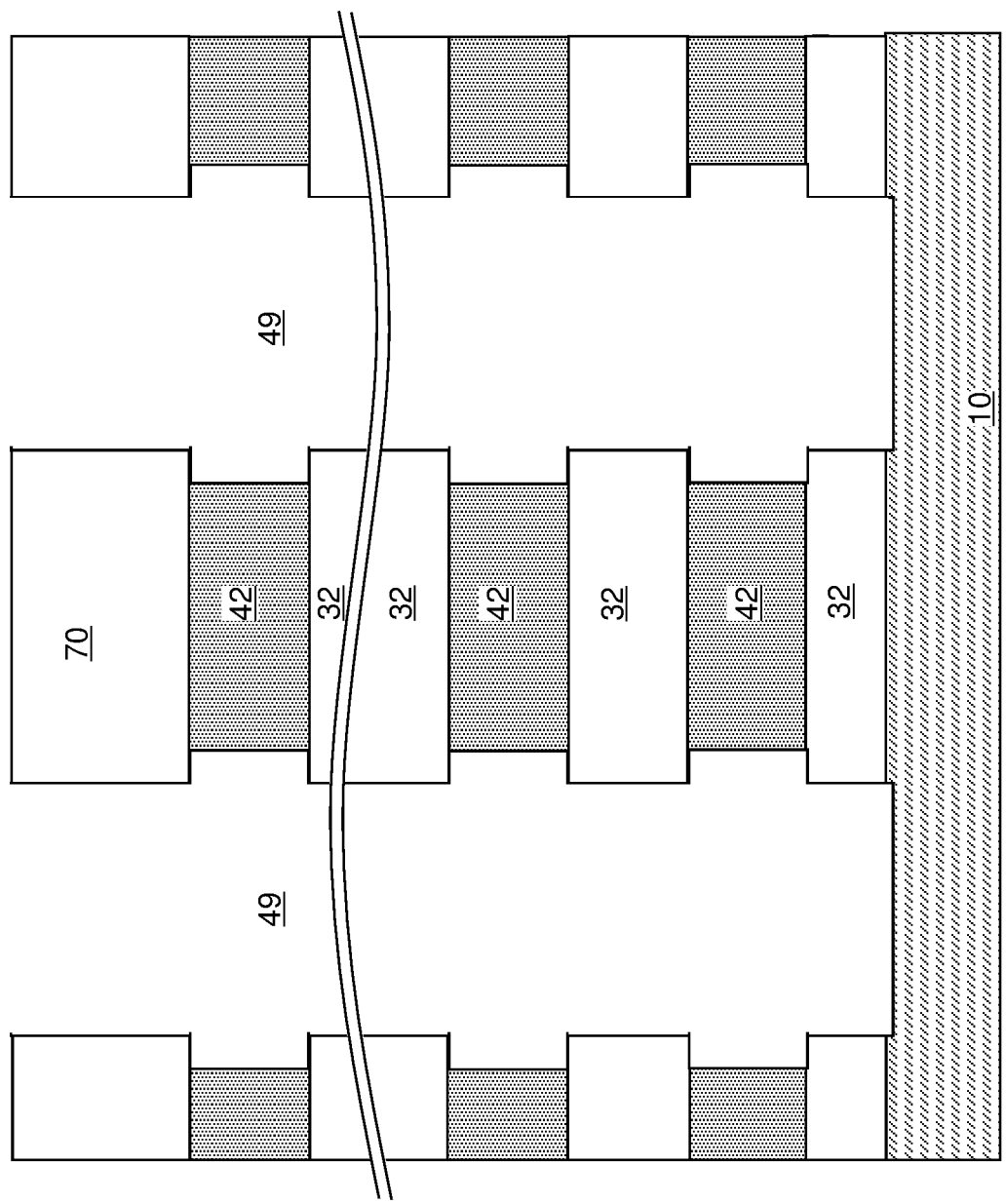
Figure 16C:
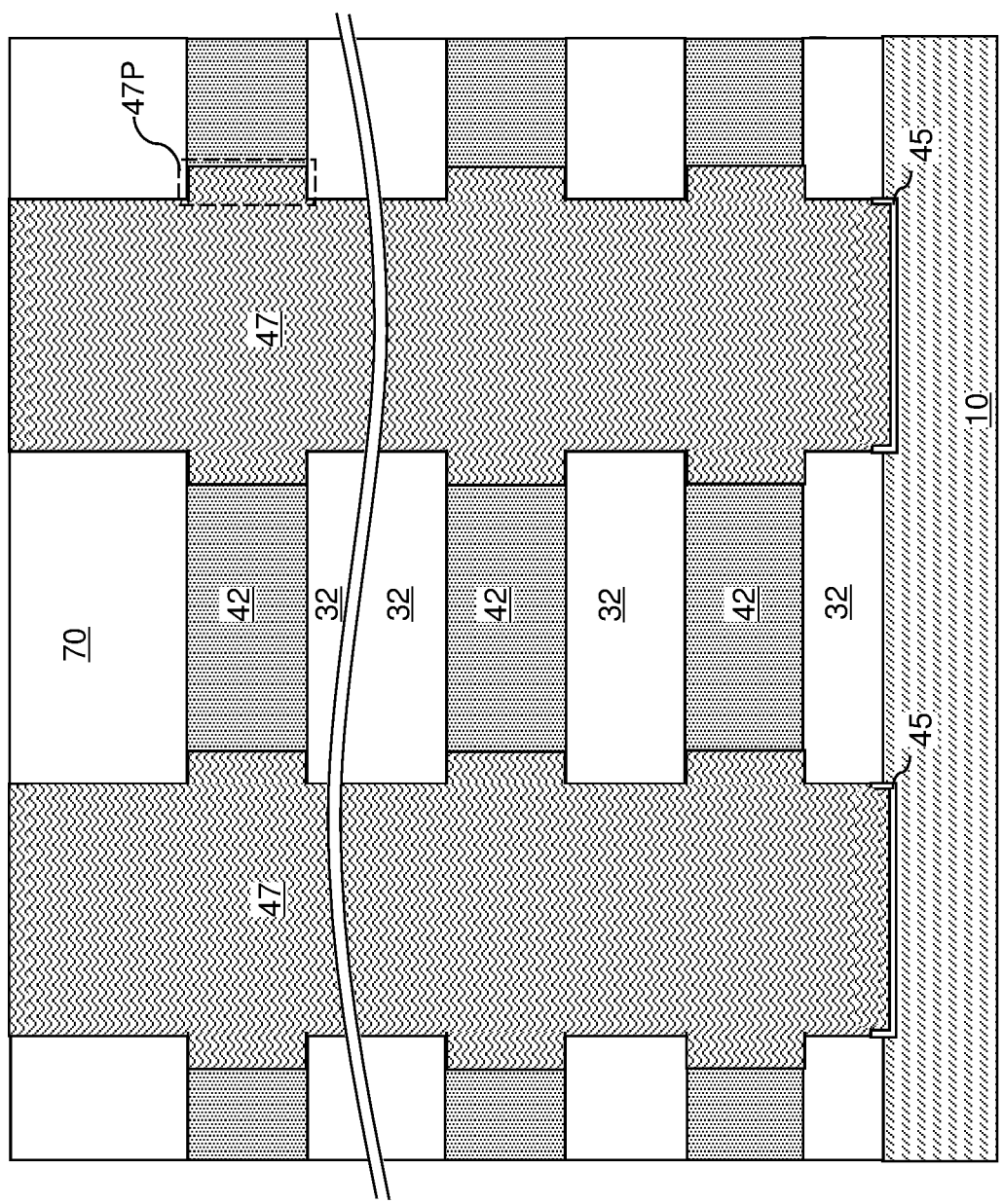

FIGS. 16A-16C are sequential vertical cross-sectional views of a memory opening of a fourth exemplary structure during formation of a sacrificial memory opening fill structure (47, 45) according to an embodiment of the present disclosure.

Referring to FIG. 16A, the fourth exemplary structure can be the same as the first exemplary structure illustrated in FIGS. 4A and 4B.

Referring to FIG. 16B, the sacrificial material layers 42 can be laterally recessed around the memory openings 49 and around the support openings 19 selective to the insulating layers 32, the insulating cap layer 70, and the semiconductor material layer 10. For example, if the sacrificial material layers 42 comprise silicon nitride, a wet etch process employing hot phosphoric acid may be used to recess the sacrificial material layers 42. The lateral recess distance may be in a range from 3 nm to 60 nm, such as from 6 nm to 30 nm, although lesser and greater lateral recess distances may also be employed.

Referring to FIG. 16C, the processing steps of FIG. 5 can be performed to form a sacrificial memory opening fill structure (47, 45) in each memory opening 49, and to form a sacrificial support opening fill structure (27, 45) in each support opening 19. Each of the sacrificial memory opening fill structures (47, 45) may comprise a sacrificial memory opening fill material portion 47 and a sacrificial semiconductor oxide liner 45. In one embodiment, each sacrificial memory opening fill material portion 47 comprises annular laterally-protruding portions 47P at each level of the sacrificial material layers 42.

FIGS. 17A-17D are sequential vertical cross-sectional views of a region of the fourth exemplary structure that includes a memory opening 49 and a backside trench 79 during formation of electrically conductive layers 46 and backside trench fill structures (74, 76).

Figure 17A:
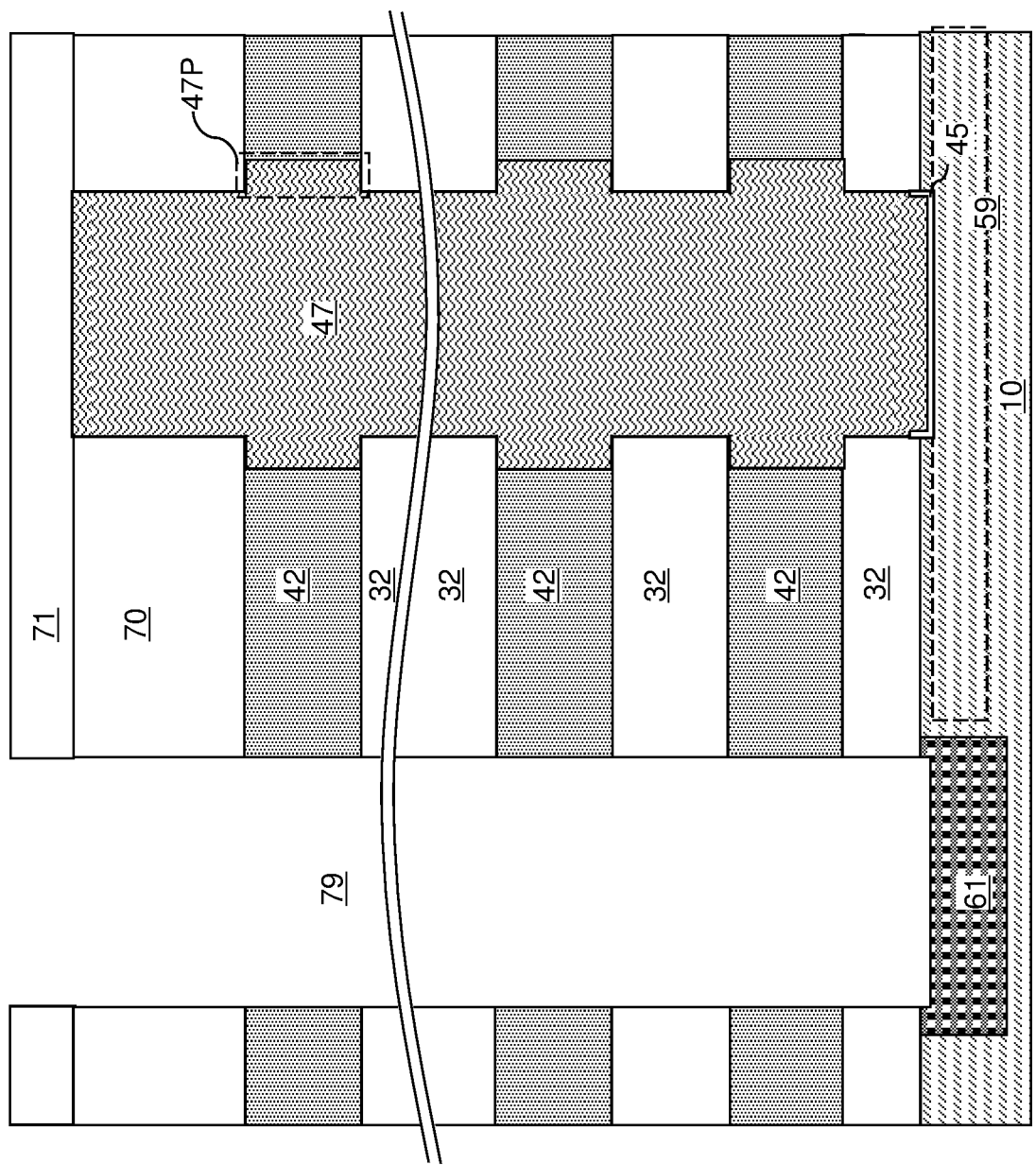

Referring to FIG. 17A, the processing steps of FIGS. 6A-6C can be performed to form a sacrificial capping dielectric layer 71, backside trenches 79, and optional source regions 61.

Referring to FIG. 17B, the processing steps of FIG. 7A can be performed to form backside recesses 43 to expose cylindrical surface segments of the sacrificial memory opening fill material portions 47 and the sacrificial support opening fill material portions 27.

Referring to FIG. 17C, processing step of FIG. 14A can be performed to form a vertical stack of silicon nitride memory elements 54 on each sacrificial memory opening fill material portion 47. Specifically, the vertical stack of silicon nitride memory elements 54 is formed by nitridation process that converts at least the outer part of the laterally-protruding portions 47P of each of the sacrificial memory opening fill material portions 47 and the laterally-protruding portions of each of the sacrificial support opening fill material portions 27 into silicon nitride. The nitridation process may comprise a thermal or plasma nitridation process in which a nitrogen containing ambient, such as nitrogen gas or ammonia are provided into the backside recesses 43 through the backside trench 79 to nitride at least the outer parts of the silicon laterally-protruding portions 47P.

Figure 17D:
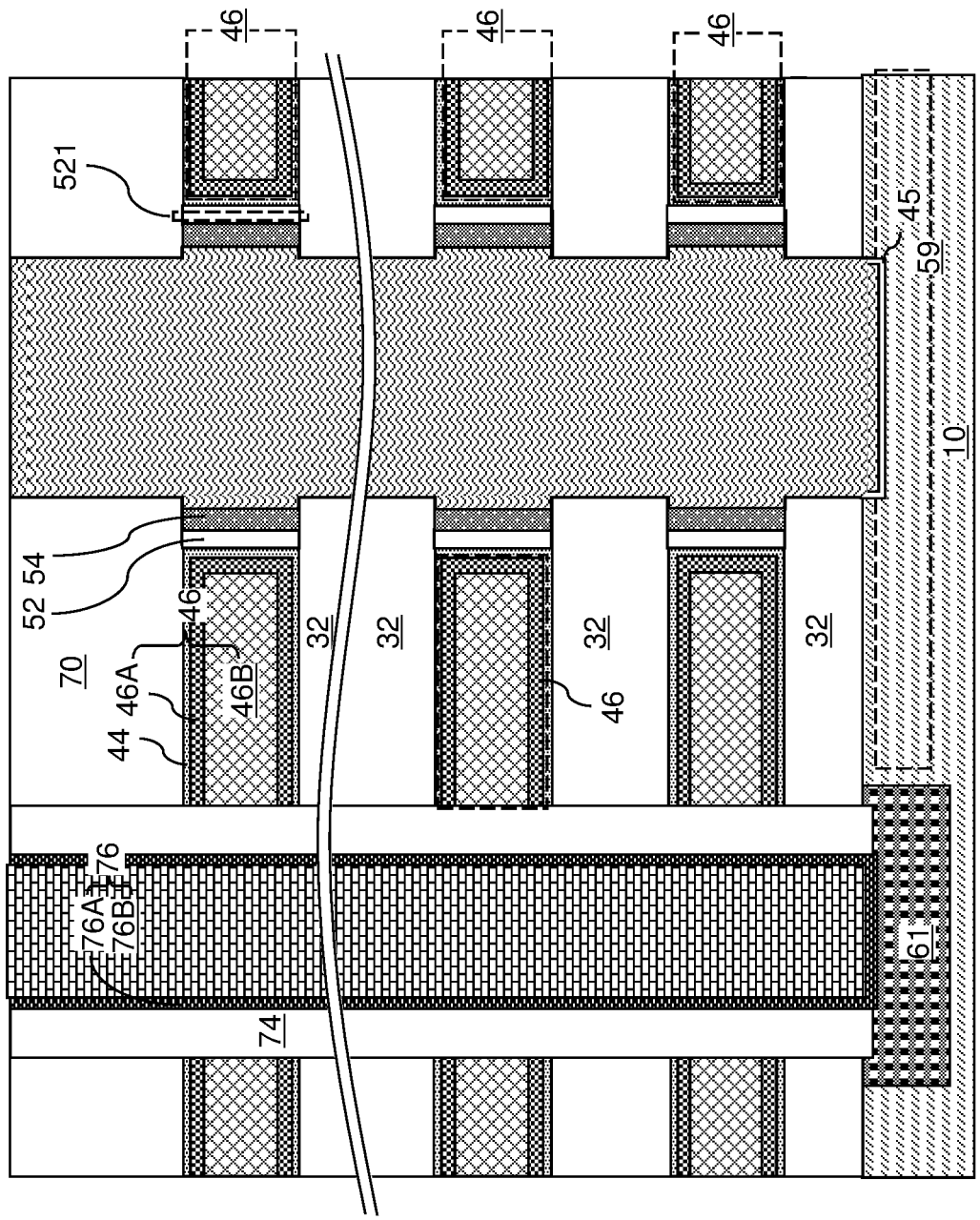

Referring to FIG. 17D, the processing steps of FIGS. 7C, 7D, and 7E can be performed to form vertical stacks of silicon oxide blocking dielectric structures 52, backside blocking dielectric layers 44, electrically conductive layers 46, and backside trench fill structures (74, 76). In one embodiment, an outer sidewall of the tunneling dielectric layer 56 within each of the memory stack structures 55 contacts each of the insulating layers 32, and vertically extends with lateral undulations from a topmost layer within the alternating stack (32, 46) to a bottommost layer within the alternating stack such that interfaces between the tunneling dielectric layer and the vertical stack of silicon nitride memory elements 54 are radially offset from interfaces between the tunneling dielectric layer 56 and the insulating layers 32

Figure 18:
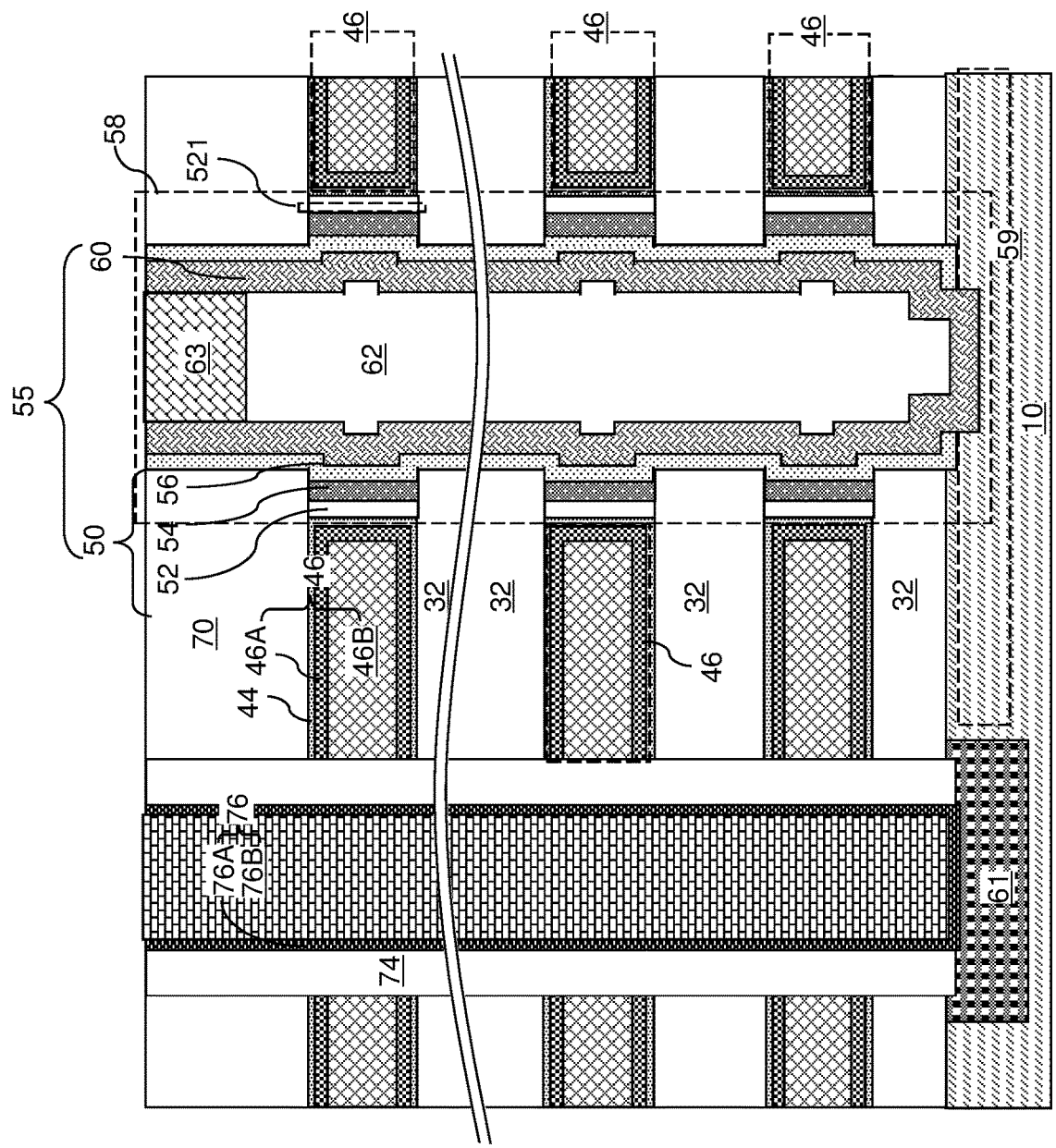
FIG. 18 is a vertical cross-sectional views of a region of the fourth exemplary structure that includes a memory opening and a backside trench after replacement of sacrificial memory opening fill structures with memory opening fill structures.

Referring to FIG. 18, the processing steps of FIGS. 8A-8D can be performed to replace the sacrificial memory opening fill structures (47, 45) with memory opening fill structures 58 and to replace the sacrificial support opening fill structures (27, 45) with support pillar structures 20. Subsequently, the processing steps of FIGS. 9, 10A, and 10B can be performed to form a contact-level dielectric layer 73 and various contact via structures (86, 88, 8P).

Referring to all drawings and according to various embodiments of the present disclosure, a three-dimensional memory device is provided, which comprises: an alternating stack of insulating layers 32 and electrically conductive layers 46; and memory stack structures 55 extending through the alternating stack (32, 46), wherein each of the memory stack structures 55 comprises a vertical semiconductor channel 60, a tunneling dielectric layer 56 vertically extending through the alternating stack (32, 46), a vertical stack of discrete silicon nitride memory elements 54 located at levels of the electrically conductive layers 46, and a vertical stack of discrete silicon oxide blocking dielectric structures 52 laterally surrounding the vertical stack of discrete silicon nitride memory elements 54, wherein each of the silicon oxide blocking dielectric structures 52 comprises a silicon oxynitride surface region 52I, and an atomic concentration of nitrogen atoms within the silicon oxynitride surface region 52I decreases with a lateral distance from an interface between the silicon oxynitride surface region 52I and a respective one of the silicon nitride memory elements 54.

In one embodiment, the silicon oxynitride surface region 52I contacts the respective one of the silicon nitride memory elements 54. In one embodiment, each of the silicon oxide blocking dielectric structures 52 comprises a top surface contacting a respective first one of the insulating layers 32 and a bottom surface contacting a respective second one of the insulating layers 32. In one embodiment, the top surface of each of the silicon oxide blocking dielectric structures 52 comprises a respective first annular top surface in which an outer periphery is laterally offset from an inner periphery by a same lateral offset distance; and the bottom surface of each of the silicon oxide blocking dielectric structures 52 comprises a respective second annular bottom surface.

In one embodiment, each of the silicon nitride memory elements 54 comprises a top surface contacting a respective first one of the insulating layers 32 and a bottom surface contacting a respective second one of the insulating layers 32. In one embodiment, the top surface of each of the silicon nitride memory elements 54 comprises a respective first annular top surface in which an outer periphery is laterally offset from an inner periphery by a same lateral offset distance; and the bottom surface of each of the silicon nitride memory elements 54 comprises a respective second annular bottom surface.

In one embodiment, each contiguous pair of a silicon oxide blocking dielectric structure 52 of the silicon oxide blocking dielectric structures 52 and a silicon nitride memory element 54 of the silicon nitride memory elements 54 has a same height.

In one embodiment, the tunneling dielectric layer 56 is in contact with inner sidewalls of the vertical stack of discrete silicon nitride memory elements 54 within a respective one of the memory stack structures 55, and is in contact with each of the insulating layers 32 in the alternating stack (32, 46).

In one embodiment, the vertical stack of discrete silicon oxide blocking dielectric structures 52 does not contact, and is laterally spaced by the vertical stack of discrete silicon nitride memory elements 54 from, the tunneling dielectric layer 56 within each of the memory stack structures 55.

In one embodiment, an outer tubular sidewall of the tunneling dielectric layer 56 within each of the memory stack structures 55 contacts each of the insulating layers 32, and vertically extends straight from a topmost layer within the alternating stack (32, 46) to a bottommost layer within the alternating stack (32, 46).

In one embodiment, the tunneling dielectric layer 56 within each of the memory stack structures 55 is laterally spaced from the insulating layers 32 by a respective vertical stack of discrete silicon oxide spacers 53; and an outer tubular sidewall of the tunneling dielectric layer 56 within each of the memory stack structures 55 vertically extends straight from a topmost layer within the alternating stack (32, 46) to a bottommost layer within the alternating stack (32, 46).

In one embodiment, an outer sidewall of the tunneling dielectric layer 56 within each of the memory stack structures 55 contacts each of the insulating layers 32, and vertically extends with lateral undulations from a topmost layer within the alternating stack (32, 46) to a bottommost layer within the alternating stack such that interfaces between the tunneling dielectric layer and the vertical stack of discrete silicon nitride memory elements 54 are radially offset from interfaces between the tunneling dielectric layer 56 and the insulating layers 32.

In one embodiment, each of the electrically conductive layers 46 is spaced from a most proximal pair of insulating layers 32 of the insulating layers 32 and from the memory stack structures 55 by a backside blocking dielectric layer 44; and the backside blocking dielectric layer 44 comprises an upper horizontally-extending portion, a lower horizontally-extending portion, and a tubular portion that connects the upper horizontally-extending portion and the lower horizontally-extending portion and laterally surrounding a respective one of the memory stack structures 55.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers; and
memory stack structures extending through the alternating stack, wherein each of the memory stack structures comprises a vertical semiconductor channel, a tunneling dielectric layer vertically extending through the alternating stack, a vertical stack of discrete silicon nitride memory elements located at levels of the electrically conductive layers, and a vertical stack of discrete silicon oxide blocking dielectric structures laterally surrounding the vertical stack of silicon nitride memory elements,
wherein each of the silicon oxide blocking dielectric structures comprises a silicon oxynitride surface region, and an atomic concentration of nitrogen atoms within the silicon oxynitride surface region decreases with a lateral distance from an interface between the silicon oxynitride surface region and a respective one of the silicon nitride memory elements.

2. The three-dimensional memory device of claim 1, wherein the silicon oxynitride surface region contacts the respective one of the silicon nitride memory elements.

3. The three-dimensional memory device of claim 1, wherein:
each of the silicon oxide blocking dielectric structures comprises a top surface contacting a respective first one of the insulating layers and a bottom surface contacting a respective second one of the insulating layers;
the top surface of each of the silicon oxide blocking dielectric structures comprises a respective first annular top surface in which an outer periphery is laterally offset from an inner periphery by a same lateral offset distance; and
the bottom surface of each of the silicon oxide blocking dielectric structures comprises a respective second annular bottom surface.

4. The three-dimensional memory device of claim 1, wherein each of the silicon nitride memory elements comprises a top surface contacting a respective first one of the insulating layers and a bottom surface contacting a respective second one of the insulating layers.

5. The three-dimensional memory device of claim 4, wherein:
the top surface of each of the silicon nitride memory elements comprises a respective first annular top surface in which an outer periphery is laterally offset from an inner periphery by a same lateral offset distance; and
the bottom surface of each of the silicon nitride memory elements comprises a respective second annular bottom surface.

6. The three-dimensional memory device of claim 1, wherein each contiguous pair of a silicon oxide blocking dielectric structure of the silicon oxide blocking dielectric structures and a silicon nitride memory element of the silicon nitride memory elements has a same height.

7. The three-dimensional memory device of claim 1, wherein the tunneling dielectric layer is in contact with inner sidewalls of the vertical stack of discrete silicon nitride memory elements within a respective one of the memory stack structures, and is in contact with each of the insulating layers in the alternating stack.

8. The three-dimensional memory device of claim 1, wherein the vertical stack of discrete silicon oxide blocking dielectric structures does not contact, and is laterally spaced by the vertical stack of discrete silicon nitride memory elements from, the tunneling dielectric layer within each of the memory stack structures.

9. The three-dimensional memory device of claim 1, wherein an outer tubular sidewall of the tunneling dielectric layer within each of the memory stack structures contacts each of the insulating layers, and vertically extends straight from a topmost layer within the alternating stack to a bottommost layer within the alternating stack.

10. The three-dimensional memory device of claim 1, wherein:
- the tunneling dielectric layer within each of the memory stack structures is laterally spaced from the insulating layers by a respective vertical stack of discrete silicon oxide spacers; and
- an outer tubular sidewall of the tunneling dielectric layer within each of the memory stack structures vertically extends straight from a topmost layer within the alternating stack to a bottommost layer within the alternating stack.

11. The three-dimensional memory device of claim 1, wherein an outer sidewall of the tunneling dielectric layer within each of the memory stack structures contacts each of the insulating layers, and vertically extends with lateral undulations from a topmost layer within the alternating stack to a bottommost layer within the alternating stack such that interfaces between the tunneling dielectric layer and the vertical stack of discrete silicon nitride memory elements are radially offset from interfaces between the tunneling dielectric layer and the insulating layers.

12. The three-dimensional memory device of claim 1, wherein:
- each of the electrically conductive layers is spaced from a most proximal pair of insulating layers of the insulating layers and from the memory stack structures by a backside blocking dielectric layer; and
- the backside blocking dielectric layer comprises an upper horizontally-extending portion, a lower horizontally-extending portion, and a tubular portion that connects the upper horizontally-extending portion and the lower horizontally-extending portion and laterally surrounding a respective one of the memory stack structures.

* * * * *